(12) United States Patent
Sutardja

(10) Patent No.: US 6,750,727 B1
(45) Date of Patent: Jun. 15, 2004

(54) LOW PHASE NOISE MOS LC OSCILLATOR

(75) Inventor: Sehat Sutardja, Cupertino, CA (US)

(73) Assignee: Marvell International, Ltd., Hamilton (BM)

( * ) Notice: Subject to any disclaimer, the term of this patent is extended or adjusted under 35 U.S.C. 154(b) by 76 days.

(21) Appl. No.: 09/699,772

(22) Filed: Oct. 30, 2000

Related U.S. Application Data

(60) Provisional application No. 60/204,885, filed on May 17, 2000.

(51) Int. Cl.[7] .................................................. H03L 5/00
(52) U.S. Cl. ............................ 331/117 R; 331/116 FE; 331/117 FE; 331/167; 331/108 B; 331/46; 331/45; 330/253
(58) Field of Search .......................... 331/167, 116 FE, 331/117 FE, 117 R, 108 B, 46, 45, 113 R; 330/253

(56) References Cited

U.S. PATENT DOCUMENTS

| | | | |
|---|---|---|---|
| 5,475,345 A | 12/1995 | Gabara ................. 331/117 FE |
| 5,714,911 A | 2/1998 | Gilbert ......................... 331/57 |
| 5,850,163 A | 12/1998 | Drost et al. .................. 331/115 |
| 5,920,235 A | * 7/1999 | Beards et al. ............ 331/108 D |
| 5,949,295 A | 9/1999 | Schmidt .................. 331/117 R |
| 5,959,504 A | 9/1999 | Wang ..................... 331/117 FE |
| 6,008,701 A | 12/1999 | Gilbert .......................... 331/57 |

OTHER PUBLICATIONS

"A 1.8 Ghz CMOS Voltage–Controlled Oscillator", B. Razavi, Digest of Technical Papers.43rd ISSCC, 1997, pp. 388–389, and Fig. 4.

"Design Issues In CMOS Differential LC Oscillators," Hajimiri, H. et al., IEEE Journal of Solid–State Circuits, pp. 717–724, May 1999, vol. 34 Issue No. 5.

* cited by examiner

*Primary Examiner*—Arnold Kinkead

(57) ABSTRACT

A cross-coupled differential MOS oscillator having reduced phase noise is applicable to a RF communication device such as a transmitter or receiver. The oscillator having low phase noise is formed of a frequency dependent amplifier to amplify a signal having a fundamental frequency; a frequency dependent feedback device that is connected between an output of the frequency dependent amplifier and an input of the frequency dependent amplifier to feed a portion of an amplified signal having the fundamental frequency to an input of the frequency dependent amplifier to stimulate oscillation; and a attenuating device in communication with the frequency dependent amplifier. The attenuating device reduces the gain of the frequency dependent amplifier for signals having frequencies much, much less than the fundamental frequency to decrease the phase noise.

60 Claims, 12 Drawing Sheets

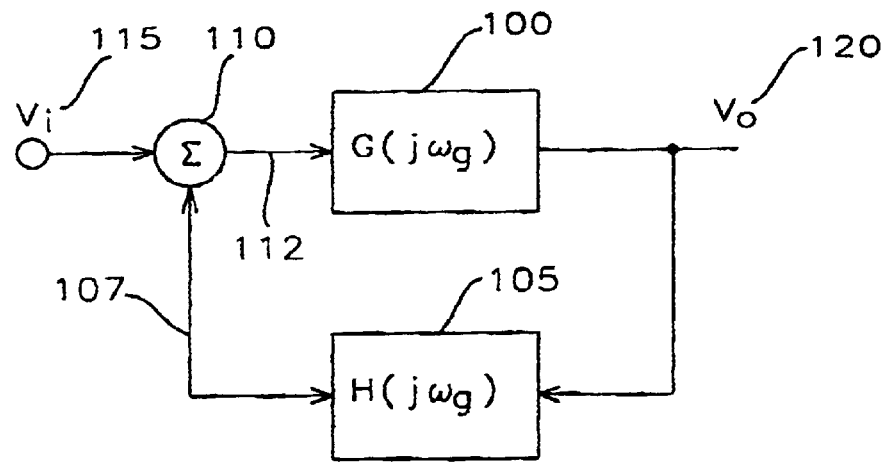
FIG. 1 - Prior Art
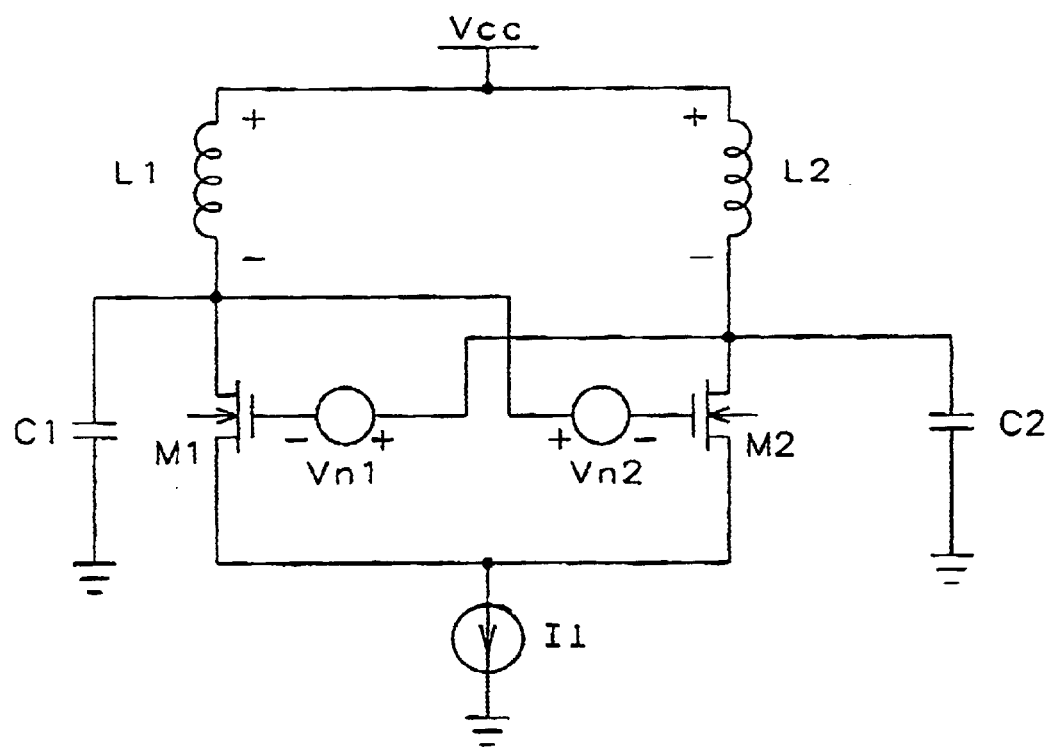
FIG. 2 - Prior Art

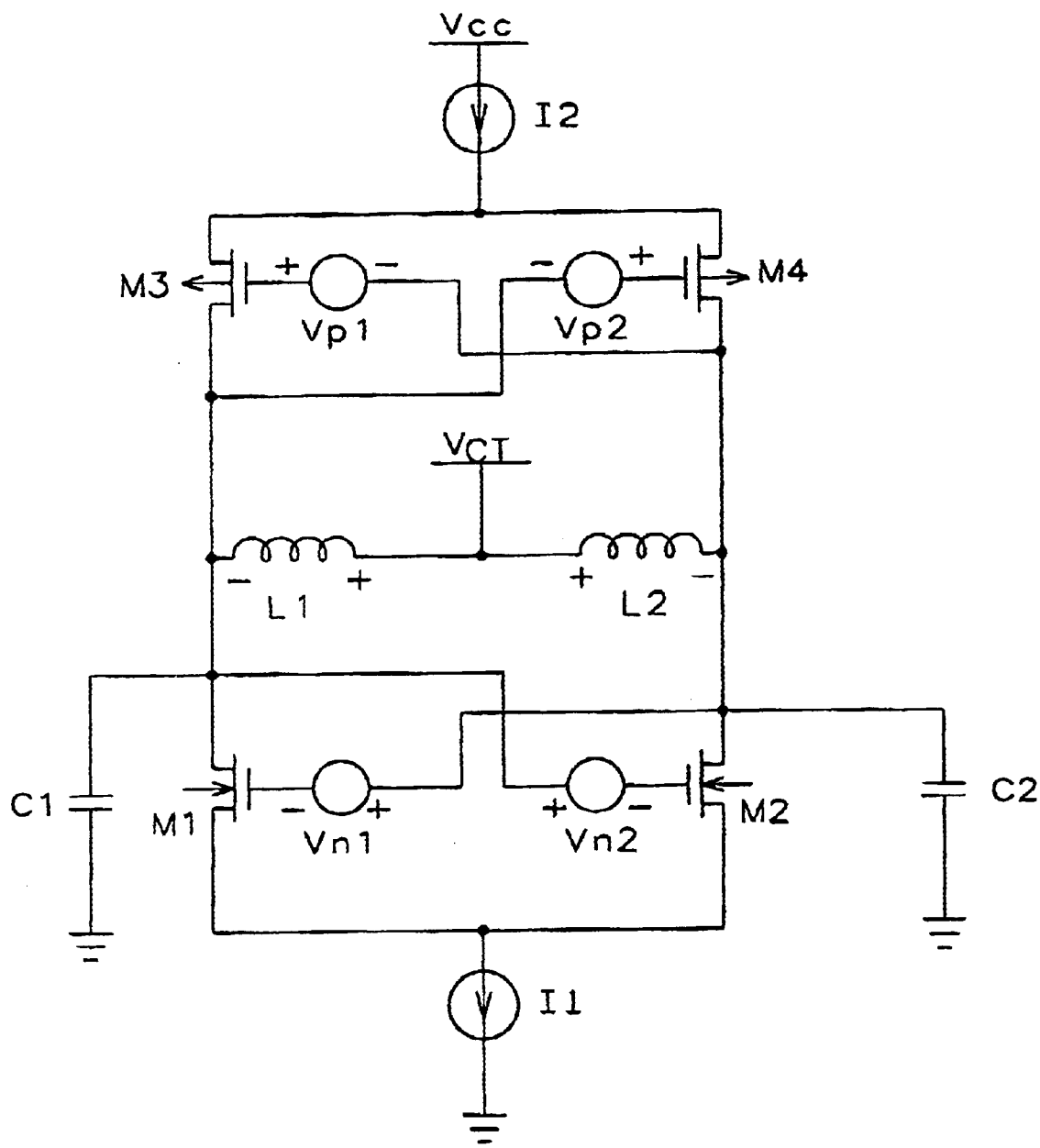
FIG. 3 — Prior Art

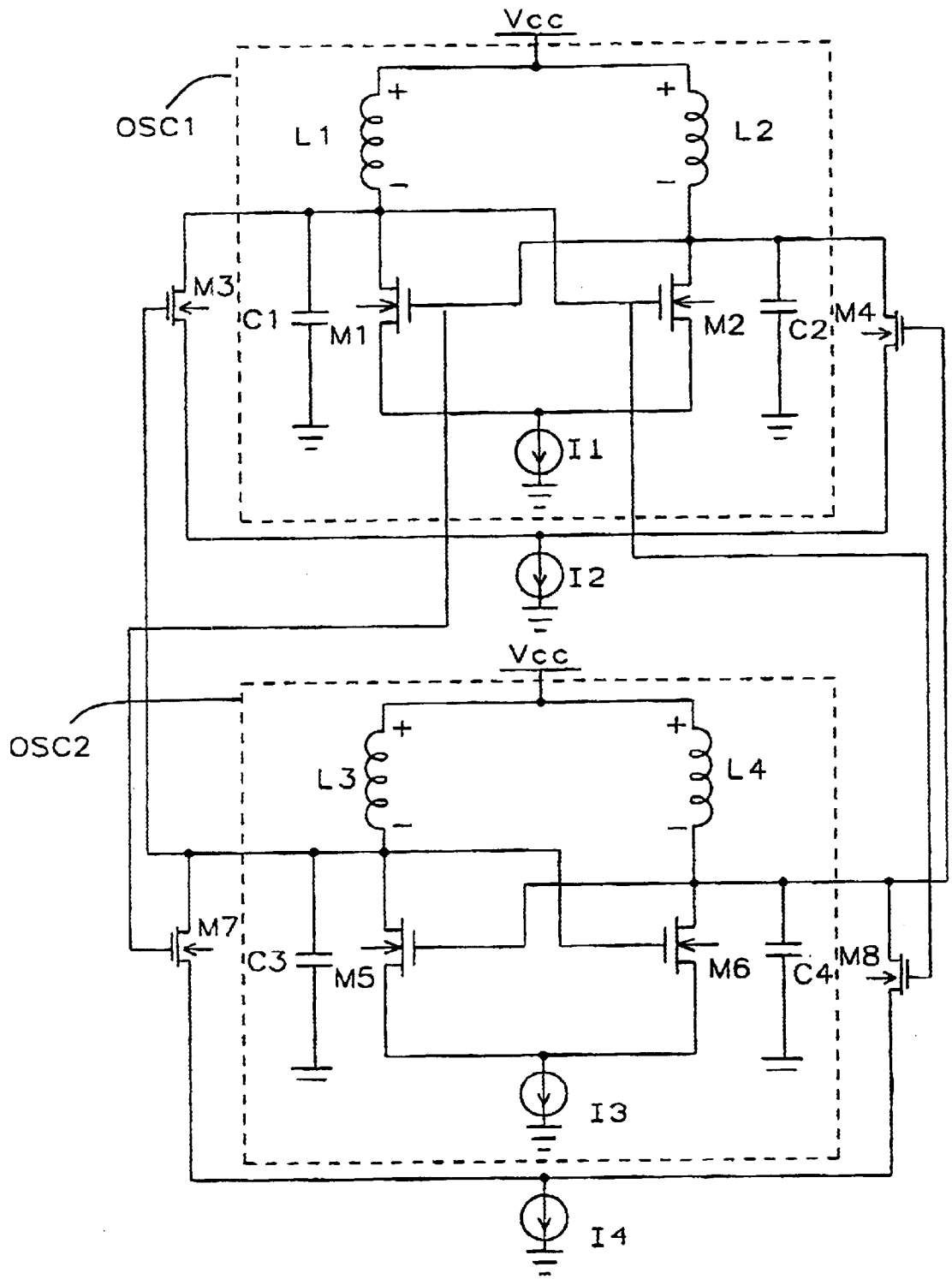
FIG. 4 — Prior Art

LOW PHASE NOISE MOS LC OSCILLATOR

This application is based on a provisional patent application, 60/204885, filed on May 17, 2000.

BACKGROUND OF THE INVENTION

1. Field of the Invention

This invention relates to high frequency oscillator circuits. More particularly, this invention relates to metal oxide semiconductors (MOS) oscillators having low phase noise.

2. Description of the Related Art

Inductive/capacitive (LC) oscillators are important elements of any Radio Frequency (RF) communication devices, such as transmitters, where the LC oscillators are used as master oscillators, or as receivers where the LC oscillators are used as local oscillators. An important performance benchmark of and LC oscillator is the phase noise characteristic. An oscillator with a lower phase noise indicates that the oscillator produces lower spurious energy outside the desired fundamental signal tone.

Phase noise is produced as a result of low frequency noise signal found in active elements used in the oscillator. This low frequency signal is modulated (up converted) by the fundamental signal tone, resulting in the spreading of the oscillator frequency energy beyond the intended target frequency. This low frequency noise signal is often referred to as flicker noise (commonly referred to in the literature as 1/f) in bipolar and Metal Oxide Semiconductor (MOS) transistors. The 1/f noise energy in bipolar transistors is known to be significantly less than that of MOS transistors. This is the reason why practically all low phase noise LC oscillators are built using bipolar transistors or even more esoteric transistors such as Galium-Arsenide devices.

Complementary MOS (CMOS) based LC oscillators are now being investigated again for application to systems-on-a-chip (SOC) devices for RF communication applications. LC oscillators of the prior art fall far short of the minimum performance requirements of many of today's wireless communication systems.

A typical example of an LC oscillator in MOS technology is shown in FIG. 2. It is based on cross-coupled NMOS transistors M1 and M2, a pair of inductors L1 and L2, and capacitor C1 and C2 tuning elements. PMOS transistors, which usually have slightly lower 1/f noise characteristics, can be used to replace the NMOS transistors M1 and M2 at a slight increase in power dissipation and lower maximum operating frequency.

A review of a general form of the criteria for designing an oscillator circuit of the prior art is shown in FIG. 1. The necessary components of an oscillator are a frequency dependent gain circuit 100, a frequency dependent feedback circuit 105, and a combining block 110. The output $V_O$ 120 of the gain circuit 100 is the input to the feedback circuit 105. The input signal $V_1$ 115 is combined in the combining block 110 with the output $V_{fb}$ 107 of the feedback circuit 105 to form the input 112 of the gain circuit 100.

The gain of the gain block 100 is designated ($G(j\omega)$) and the gain of the feedback circuit 105 is designated $H(j\omega)$. These gains $G(j\omega)$ and $H(j\omega)$ describe the relationship of their respective output signals $V_o$ 120 and $V_{fb}$ 107 to their respective input signals 112 and $V_o$ 120. Therefore, the output signal $V_o$ 120 becomes $$V_o = \frac{V_i G(j\omega)}{1 + G(j\omega)H(j\omega)}$$

For an oscillator, the output signal $V_o$ 120 must be nonzero even if the input voltage $V_1$ 115 is zero. For this to be true, then $$1 + G(j\omega)H(j\omega) = 0$$

or $$G(j\omega)H(j\omega) = -1$$

That is, the magnitude of the open-loop transfer function must be equal to 1 and the phase shift of the gain circuit 100 and the feedback circuit 105 must be 180°.

In FIG. 2, the gain circuit of the oscillator is formed by the differentially cross-connected pair of transistors M1 and M2 and the constant current source I1. The frequency dependent gain determining impedances are formed by the inductors L1 and L2 and the capacitors C1 and C2.

The feedback circuit is accomplished by the connecting of the drain of the NMOS transistor M1 to the gate of the NMOS transistor M2 and the drain of the NMOS transistor M2 to the gate of the NMOS transistor M1. This forms a cross-coupled differential oscillator.

A CMOS oscillator of the prior art is illustrated in FIG. 3. In this case, the gain circuit is formed by the differentially connected pair of NMOS transistors M1 and M2, the differentially connected pair of PMOS transistors M3 and M4, and the current sources I1 and I2. As described above, the frequency dependent gain determining impedances are formed by the inductors L1 and L2 and capacitors C1 and C2.

The fundamental frequency f0 of a cross coupled differential oscillator is determined by the formula:

$$\omega = \frac{1}{\sqrt{L_{eff} C_{eff}}} \text{ such that } f_o = \frac{1}{2\pi \sqrt{L_{eff} C_{eff}}}$$

where:
$L_{elf}$ is the value of the effective inductance of the inductors L1 and L2.
$C_{eff}$ is the value of the effective capacitance of the capacitors C1 and C2.

For the structure of the design where the inductors are mutually coupled then the effective inductance is:

$$L_{eff} = 4L1 = 4L2$$

The effective capacitance of the capacitors C1 and C2 is the parallel combination of the two capacitors C1 and C2 and is:

$$C_{eff} = \tfrac{1}{2}C1 = \tfrac{1}{2}C2$$

Combining the above, the frequency of the oscillators of FIGS. 2 and 3 is:

$$f_o = \frac{1}{2\pi \sqrt{2L1C2}}.$$

It should be noted that the capacitances C1 and C2 included the parasitic capacitances of the oscillator circuit.

It is well known in the art that phase noise is the result of small perturbations in phase due to small random shifts in oscillator frequency. These shifts are caused by thermal noise, shot noise, and flicker noise (1/f noise). These noises are functions of the device characteristics of the NMOS transistors M1 and M2 of FIGS. 2 and 3 and the PMOS transistors M3 and M4 of FIG. 3. The phase noise is modeled as small voltage sources Vn1 and Vn2 at the gates of the NMOS transistors M1 and M2 of FIGS. 2 and 3 and voltage sources Vp1 and Vp2 at the gates of the PMOS transistors M4 and M4 of FIG. 3.

The flicker noise (1f/noise) is a function of the active device characteristics of the NMOS transistors M1 and M2 of FIGS. 1 and 2 and PMOS transistors M3 and M4 of FIG. 3.

The advancements in scaling of the device features in semiconductor processing allow multi-gigahertz operating frequencies to be readily achievable. Unfortunately, the same scaling down of MOS transistors have the opposite effect on the 1/f noise characteristics. The smaller device geometries are, the higher the 1/f noise components, leading to higher phase noise on the final oscillator.

"A 1.8 Ghz CMOS Voltage-Controlled Oscillator",— Razavi, B., Digest of Technical Papers, 43rd ISSCC, 1997, pp. 388–389 and shown in FIG. 4 describes a structure of having multiple oscillators OSC1 and OSC2 coupled together to oscillate in quadrature or 90° out-of-phase. The oscillator OSC1 and OSC2 are structured and function as described in FIG. 2. The differential pair of NMOS transistors M3 and M4 and the current source 12 form a first coupling circuit. The first coupling circuit has an in-phase input that is formed by the gate of the NMOS transistors M3 and a out-of-phase input that is formed by the gate of the NMOS transistors M4. The first coupling circuit has a in-phase output that is formed by the drain of the NMOS transistor M4 and an out-of-phase output that is formed by the drain of the NMOS transistor M3. The in-phase input of the first coupling circuit is connected to the drain of the NMOS transistor M5 and the gate of the NMOS transistor M6. The out-of-phase input of the first coupling circuit is connected to the drain of the NMOS transistor M6 and the gate of the NMOS transistor M5. The in-phase output of the first coupling circuit is connected to the drain of the NMOS transistor M2 and the gate of the NMOS transistor M1. The out-of-phase output of the first coupling circuit is connected to the drain of the NMOS transistor M1 and the gate of the NMOS transistor M2.

The differential pair of NMOS transistors M7 and M8 and the current source 14 form a second coupling circuit. The second coupling circuit has an in-phase input that is formed by the gate of the NMOS transistors M7 and a out-of-phase input that is formed by the gate of the NMOS transistor M8. The second coupling circuit has a in-phase output that is formed by the drain of the NMOS transistor M8 and an out-of-phase output that is formed by the drain of the NMOS transistor M7. The in-phase input of the second coupling circuit is connected to the drain of the NMOS transistor M2 and the gate of the NMOS transistor M1. The out-of-phase input of the second coupling circuit is connected to the drain of the NMOS transistor M1 and the gate of the NMOS transistor M2. The in-phase output of the second coupling circuit is connected to the drain of the NMOS transistor M6 and the gate of the NMOS transistor M5. The out-of-phase output of the second coupling circuit is connected to the drain of the NMOS transistor M6 and the gate of the NMOS transistor M5.

The structure as shown generates two oscillatory signals, one between the drains of the NMOS transistors M1 and M2 and one between the drains of the NMOS transistors M5 and M6. The two oscillatory signals are in quadrature or 90° out of phase. The quadrature oscillator as described is subject to the phase noise problems as above-described.

"Design Issues in CMOS Differential LC Oscillators," Hajimiri, A., Lee, T. H., IEEE Journal of Solid-State Circuits, pp. 717–724, May 1999 Vol. 34 Issue No. 5, presents an analysis of phase noise in differential cross-coupled inductance-capacitance (LC) oscillators. The effect of tail current and tank powder dissipation on the voltage amplitude is shown. Various noise sources in the complementary cross-coupled pair are identified, and their effect on phase noise is analyzed.

"Phase Noise in CMOS Differential LC Oscillators", Hajimiri, A., Lee, T. H., Digest of Technical Papers—1988 Symposium on VLSI Circuits, 1988, pp. 48–51, describes an analysis of phase noise in differential cross-coupled tuned tank voltage controlled oscillators. The effect of active device noise sources as well as the noise due to the passive elements is taken into account.

U.S. Pat. No. 5,475,345 (Gabara) teaches a CMOS coupled-tank oscillator having two inverters coupled, input-to-output, by inductances that may be simply wires, and a capacitance acting in parallel with each inverter that may be, simply, the inverter's gate capacitance.

U.S. Pat. No. 5,850,163 (Drost, et al.) discusses an active inductor oscillator with wide frequency range. The active inductor oscillator includes a tank circuit, buffer and integrating circuit that use differential transistor pairs that reduce phase jitter due to external common-mode noise sources.

U.S. Pat. No. 5,959,504 (Wang) describes a voltage controlled oscillator CMOS circuit using back gate terminals of CMOS transistors to vary the parasitic capacitances of the transistors. The back gate terminals receive a signal from a variable voltage source so that oscillation can be controlled by adjusting the variable voltage.

"A Low-Noise, 900-MHz VCO in 0.6um CMOS" (Park, et al), IEEE Journal Of Solid-State Circuits, Vol. 34, pp 586–591, May 1999, Issue No. 5, describes a low-noise, 900 MHz, voltage controlled oscillator (VCO) fabricated in a 0.6-um CMOS technology. The VCO consists of four-stage fully differential delay cells performing full switching. It utilizes dual-delay path techniques to achieve high oscillation frequency and obtain a wide tuning range.

"10 MHz CMOS OTA-C Voltage-Controlled Quadrature Oscillator," Linares-Barranco, et al., IEEE Electronics Letters, June 1989, pp. 765–767, Vol. 25, Issue No. 12, details a quadrature-type voltage-controlled oscillator with operational transconductance amplifiers and capacitors (OTA-C).

"RC Sequence Asymmetric Polyphase Networks for RF Integrated Transceives," Galal et al. Transactions On Circuits And Systems—II: Analog And Digital Signal Processing, January 2000, pp. VOL 47, Issue No. 1, describes Resistance-Capacitance (RC) sequence asymmetric polyphase networks. A sequence of asymmetric polyphase networks provide the generation of highly matched wide-band quadrature signals which are immune to components mismatch, and suppression of the image signals without the need for highly selective RF filters and without employing image-reject mixing technique.

U.S. Pat. No. 5,714,911 (Gilbert) describes a quadrature oscillator that includes an amplitude control circuit. The amplitude control circuit is that is based upon the trigonometric identity $\sin^2(\Omega t)+\cos^2(\Omega t)=1$. The amplitude control circuit, referred to as a Pythagorator, includes two squaring circuits. Each squaring circuit receives a respective quadrature oscillator signal and squares it. The outputs of the two squaring circuits are joined together so as to sum the outputs of the two squaring circuits to produce a sum of squares signal. This signal, a current in the preferred embodiment, is provided to damping diodes coupled to the outputs of the quadrature oscillator. The damping diodes produce a shunt positive resistance at the outputs of the quadrature oscillator in response to this current that has the effect of canceling the shunt negative resistance of the regenerative elements of the oscillator thereby establishing the amplitude of the quadrature oscillator signals at a desired amplitude.

U.S. Pat. No. 5,949,295 (Schmidt) teaches an integratable tunable resonant circuit for use in filters and oscillators. The circuit incorporates differential amplifier stage with a pair of differentially connected transistors with two negative feedback resistors. The two negative feedback resistors increase the linearity range of an input voltage of the differential amplifier stage.

U.S. Pat. No. 6,008,701 (Gilbert) details a quadrature oscillator using inherent nonlinearities of impedance cells to limit amplitude. The quadrature oscillator based on two cross-coupled integrator cells utilizing the inherent nonlinearity of positive and negative impedance cells to control the amplitude of oscillation. The oscillator is simplified thus eliminating the need for an outer control loop. A negative impedance cell is coupled to each integrator cell for assuring proper start-up and enhancing the amplitude of oscillation. A positive impedance cell is also coupled to each integrator cell to dampen the amplitude of oscillation. The transconductance of each impedance cell varies in response to the bias current provided to the cell. Thus, by controlling the bias currents through the cells, the negative and positive impedances seen by each integrator cell can made to cancel at the desired oscillation amplitude, so that the circuit oscillates without any damping or enhancement. By utilizing the inherent nonlinearity of positive and negative impedance cells, the bias currents provided to the impedance cells can remain fixed for a given frequency of operation, thereby simplifying the design of the oscillator and providing precise, robust control.

SUMMARY OF THE INVENTION

An object of this invention is to provide a cross-coupled differential MOS oscillator.

Another object of this invention is to provide a cross-coupled differential MOS oscillator having reduced phase noise.

Another object of this invention is to provide a RF communication device, e.g., a transmitter or receiver, having a cross-coupled differential MOS oscillator.

To accomplish these and other objects, an oscillator having low phase noise that is formed of a frequency dependent amplifier to amplify a signal having a fundamental frequency; a frequency dependent feedback device that is connected between an output of the frequency dependent amplifier and an input of the frequency dependent amplifier to feed a portion of an amplified signal having the fundamental frequency to an input of the frequency dependent amplifier to stimulate oscillation; and a attenuating device in communication with the frequency dependent amplifier. The attenuating device reduces the gain of the frequency dependent amplifier for signals having frequencies much, much less than the fundamental frequency to decrease the phase noise.

The frequency dependent amplifier has an amplifying means. The amplifying means has an input and an output, whereby a signal at the input is amplified by a gain factor to form a signal at the output. The frequency dependent amplifier further, has a frequency dependent gain determining in communication with the amplifying means. The frequency dependent gain determining impedance determines the frequency at which the maximum gain of the frequency dependent amplifier occurs.

The amplifying means is composed of a pair of cross-coupled MOS transistors. The drain of each MOS transistor is connected to a gate of the other MOS transistor and to a port of the frequency dependent gain determining impedance. A first current source is connected to a source of one of the MOS transistors and to a ground reference point and to a first port of the attenuating device. A second current source is connected to a source of the other MOS transistor and to a second port of the attenuating device.

The frequency dependent determining impedance is formed by at least one inductor in communication with the amplifying means and a power supply voltage source, and at least one capacitor in communication with the amplifying means and a ground reference point.

The attenuating device is in the preferred embodiment, a capacitor in communication with the sources of the cross-coupled MOS transistors. The value of the capacitor is selected such that the fundamental frequency of oscillation is from approximately 10 times to approximately 20 times the high pass bandwidth of the cross-coupled MOS transistors.

Alternately, the amplifying means is formed of a cross-coupled pair of MOS transistors of the first conductivity type and a cross-coupled pair of MOS transistors of the second conductivity type to form a CMOS amplifying means. The drain of each MOS transistor of the first conductivity type is connected to a gate of the other MOS transistor of the first conductivity type and to a port of the frequency dependent gain determining impedance. A first current source is connected to a source of one of the MOS transistors of the first conductivity type and to a first port of the attenuating device, and a second current source is connected to a source of the other MOS transistor of the first conductivity type and to a second port of the attenuating device.

The drain of each MOS transistor of the second conductivity type is connected to a gate of the other MOS transistor of the second conductivity type and to one port of the frequency dependent gain determining impedance. A third current source in communication with a source of one of the MOS transistors of the second conductivity type and to a third port of the attenuating device, and a fourth current source in communication with a source of the other MOS transistor of the second conductivity type and to a fourth port of the attenuating device.

The attenuating device in the CMOS embodiment of the amplifying means is composed of a first capacitor connected from the first port to the second port of the gain attenuating means and a second capacitor in communication with the third and fourth ports of the gain attenuating means.

An application of the cross-coupled differential MOS oscillator is as the carrier oscillator of an RF transmitter. Alternately, the cross-coupled differential MOS oscillator is the local oscillator of an RF receiver that is used to demodulate the incoming RF signal.

BRIEF DESCRIPTION OF THE DRAWINGS

FIG. 1 is a system block diagram of a frequency dependent system with feedback of the prior art.

FIG. 2 is a schematic diagram of a cross-coupled differential NMOS oscillator of the prior art.

FIG. 3 is a schematic diagram of a cross-coupled differential CMOS oscillator of the prior art.

FIG. 4 is a schematic diagram of a quadrature oscillator of the prior art.

FIG. 13b is an example of a programmable resistance of FIG. 13a.

FIG. 14b is an example of a programmable resistance of FIG. 14a.

FIG. 14c is an example of programmable inductance/resistance of FIG. 14a.

DETAILED DESCRIPTION OF THE INVENTION

Figure 5A:
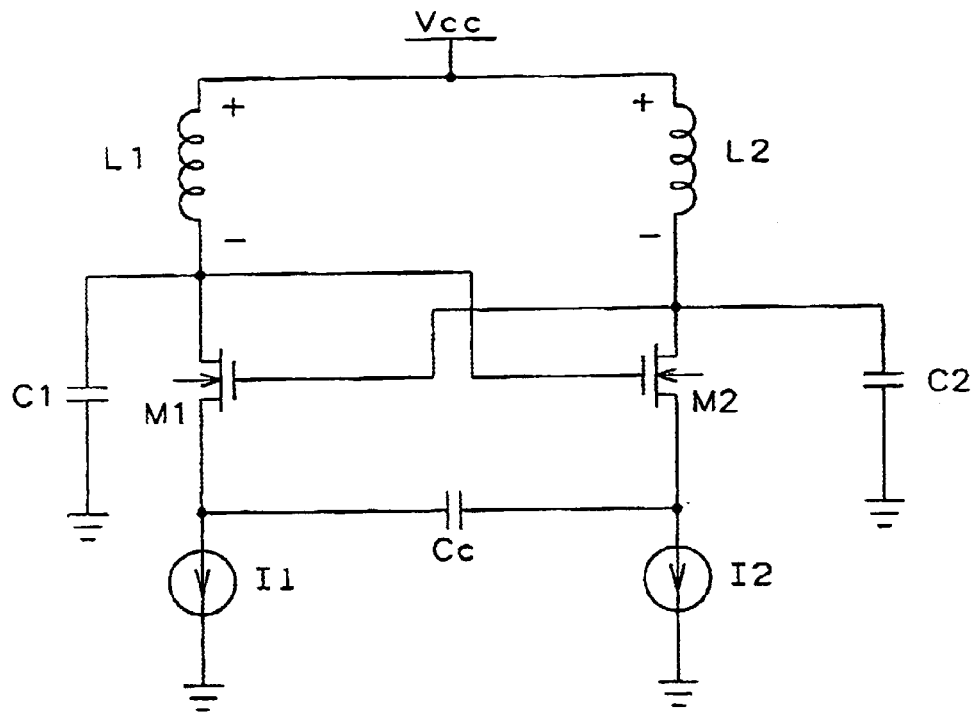
FIGS. 5a and 5b are schematic diagrams of two embodiments of cross-coupled differential MOS oscillators of this invention.

Refer now to FIG. 5a for a discussion of the cross-coupled differential NMOS oscillator having low phase noise of this invention. The frequency dependent gain amplifier is formed by the NMOS transistors M1 and M2 and the constant current sources I1 and I2. The frequency dependent gain determining impedance is formed by the inductors L1 and L2 and the capacitors C1 and C2.

The inductor L1 is connected from the drain of the NMOS transistors M1 to the reference voltage source $V_{cc}$ and the inductor L2 is connected from the drain of the NMOS transistor M2 to the reference voltage source $V_{cc}$. The capacitor C1 is connected from the drain of NMOS transistor M1 to the ground reference point and the capacitor C2 is connected from the drain of the NMOS transistor M2 to the ground reference point. It is apparent to those skilled in the art that, while the capacitors C1 and C2 are connected to the ground reference point, the capacitors C1 and C2 may be connected to any reference voltage source or to any power supply voltage source and not effect the operation of the oscillator as explained above.

The fundamental frequency $f_0$ of the cross-coupled differential oscillator of this invention is determined as:

$$\omega = \frac{1}{\sqrt{2L_1 C_1}}$$

such that $$f_o = \frac{1}{2\pi\sqrt{2L_1 C_1}}$$

where:
$L_1$ is the value of the inductance of the inductor L1 or L2.
$C_1$ is the value of the capacitance of the capacitor C1 or C2.

The drain of the NMOS transistor M1 is connected to the gate of the NMOS transistor M2 and the drain of the NMOS transistor M2 is connected to the gate of the NMOS transistor M1. This cross-coupling of the drains to the gates of the NMOS transistors M1 and M2 forms the feedback circuit of the oscillator.

The source of the NMOS transistor M1 is connected to the constant current source I1 and the source of the NMOS transistor M2 is connected to the constant current source I2. The decoupling capacitor $C_c$ is connected between the sources of the NMOS transistors M1 and M2 to act as a gain-attenuating device.

Figure 6A:
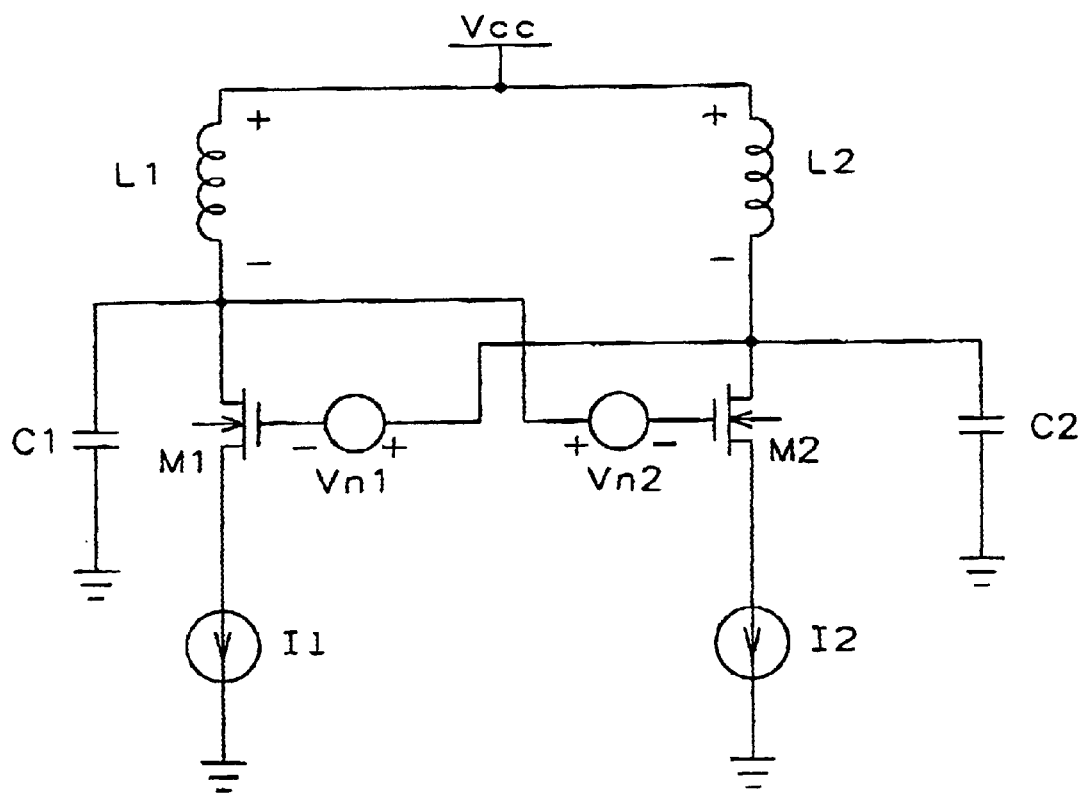
FIGS. 6a and 6b are schematic diagrams of the cross-coupled differential MOS oscillator of this invention (FIG. 5a) operating at low frequencies (FIG. 6a) and at high frequencies (FIG. 6b).
Figure 6B:
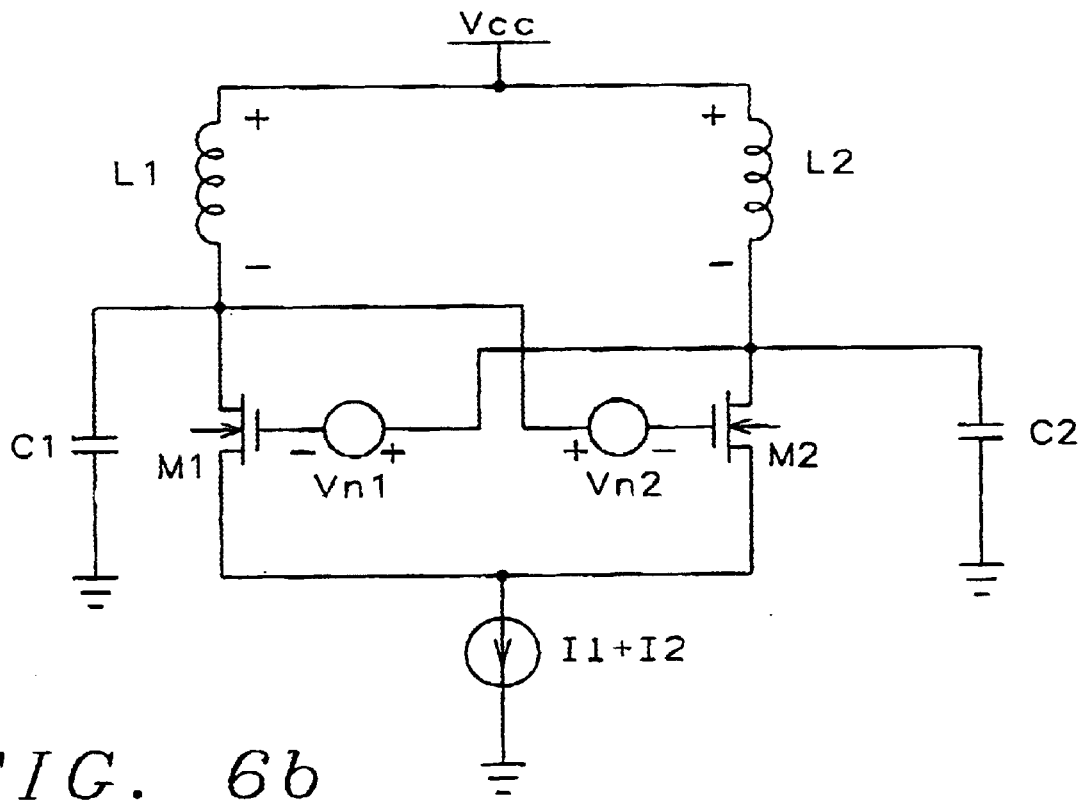

Refer now to FIGS. 6a and 6b to understand the operation of the cross-coupled differential oscillator of this invention. The decoupling capacitor $C_c$ is chosen to have very high impedance at frequencies much, much lower than the fundamental frequency $f_0$ of the cross-coupled differential NMOS oscillator of FIG. 6a. At frequencies much lower than the fundamental frequency $f_0$, the cross-coupled differential NMOS oscillator of this invention functions as shown in FIG. 6a. The current sources are separated and the gain of the frequency dependent gain circuit formed by the NMOS transistors M1 and M2 and the current sources I1 and I2 becomes much, much less than one, preventing the flicker noise or 1/f noise of the noise voltage sources Vn1 and Vn2 from being amplified and being added to the output signal of the cross-coupled differential NMOS oscillator of this invention.

At the fundamental frequency $f_0$, the decoupling capacitor $C_c$ is chosen to have an impedance that is very low. Thus, the cross-coupled differential NMOS oscillator of this invention functions as shown in FIG. 6b. The frequency dependent gain circuit formed by the NMOS transistors M1 and M2 and the constant current sources I1 and I2 function as described in FIG. 2. The constant current sources I1 and I2 are summed together to form effectively one current source (I1+I2). Thus, the frequencies at the fundamental frequency $f_0$ are amplified. The frequency gain determining impedance formed by the inductors L1 and L2 and the capacitors C1 and C2 insure that the peak gain of the frequency dependent gain circuit is at the fundamental frequency $f_0$ and that the higher and lower frequencies are attenuated.

The noise voltage sources Vn1 and Vn2 are, as described above, the models of the flicker or 1/f noise that is caused by the device characteristics of the NMOS transistors M1 and M2. The noise voltage sources Vn1 and Vn2 having frequency content that is much less than the fundamental frequency $f_0$ and thus will be attenuated as shown in FIG. 6a.

The high pass bandwidth (BW) of the cross-coupled differential oscillator is a function of the transconductance of the NMOS M1 and M2 and the value of the decoupling capacitor Cc and is determined by the formula:

$$BW = \frac{g_m}{2\pi Cc}.$$

The high pass bandwidth BW must be maintained at a level that is much, much smaller than the cutoff frequency of the cross-coupled differential oscillator to prevent loss of the fundamental frequency signal. The decoupling capacitor Cc should be chosen such that the fundamental frequency f0 of the cross-coupled differential oscillator is from approximately ten times to approximately twenty times the high pass bandwidth BW of the cross-coupled oscillator.

Figure 5B:
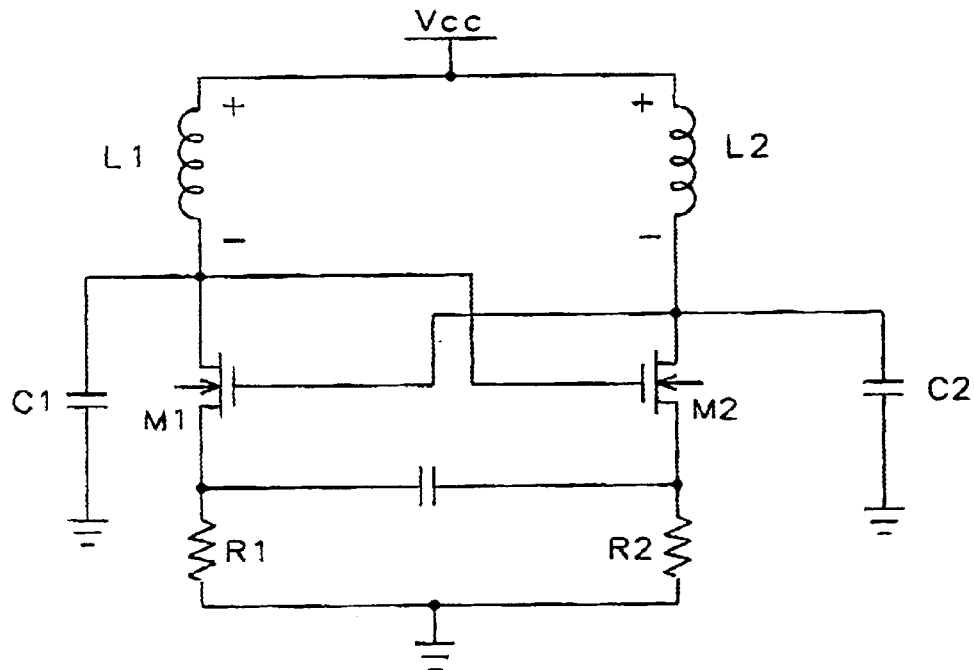

FIG. 5b illustrates a second embodiment of a cross-coupled differential NMOS oscillator of this invention. The frequency dependent gain amplifier in this case is formed by the NMOS transistors M1 and M2 and the resistors R1 and R2. The resistor R1 is connected between the source of the NMOS transistor M1 and the ground reference point. The resistor R2 is connected between the source of the NMOS transistor M2 and the ground reference point.

The inductor L1 is connected from the drain the NMOS transistor M1 to the reference voltage source $V_{cc}$ and the inductor L2 is connected from the drain of the NMOS transistor M2 to the reference voltage source $V_{cc}$. The capacitor C1 is connected from the drain of NMOS transistor M1 to the ground reference point and the capacitor C2 is connected from the drain of the NMOS transistor M2 to the ground reference point. As described above, it is apparent to those skilled in the art that, while the capacitors C1 and C2 are connected to the ground reference point, the capacitors C1 and C2 may be connected to any reference voltage source or to any power supply voltage source and not effect the operation of the oscillator.

The decoupling capacitor Cc2 is connected between the sources of the NMOS transistors M1 and M2 and acts as gain attenuating device as above-described.

Figure 7:
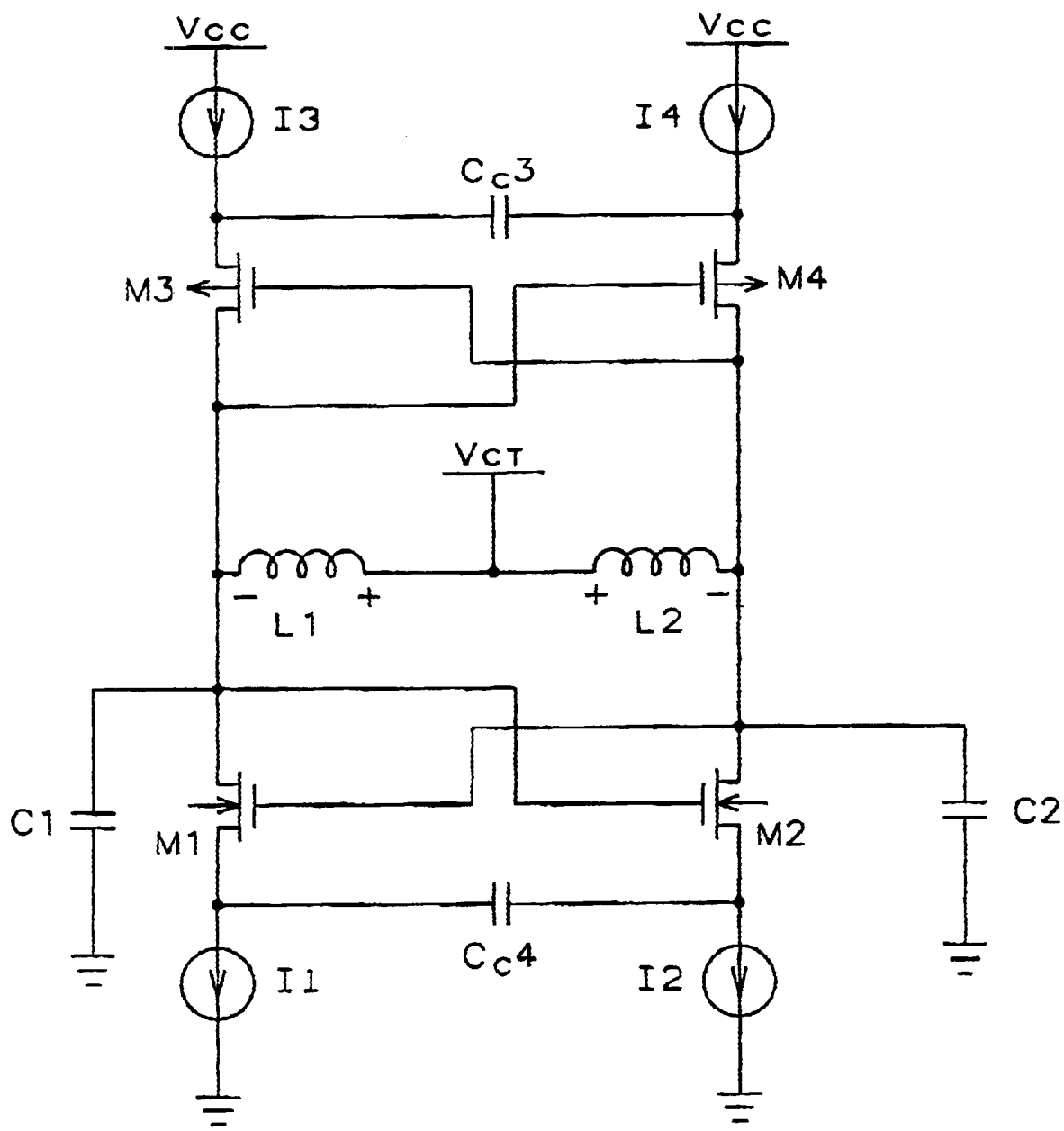
FIG. 7 is a schematic diagram of a cross-coupled differential CMOS oscillator of this invention.

A third embodiment of this invention, as shown in FIG. 7, implements the frequency dependent gain circuit as a cross-coupled differential CMOS amplifier. The frequency dependent gain circuit is formed by the NMOS transistors M1 and M2, the P-type MOS (PMOS) transistors M3 and M4, and the current sources I1, I2, I3, and I4.

The drain of the NMOS transistors M1 is connected to the gate of the NMOS transistor M2 and the drain of the NMOS transistor M2 is connected to the gate of the NMOS transistor M1. Similarly, the drain of the PMOS transistor M3 is connected to the gate of the PMOS transistor M4 and the drain of the PMOS transistor M4 is connected to the gate of the PMOS transistor M3. The cross-coupling of the drains and gates of the NMOS transistors M1 and M2 and the PMOS transistors M3 and M4 forms the feedback circuit of the oscillator.

The inductor L1 is connected between the drains of the NMOS and PMOS transistors M1 and M3 and the reference voltage source $V_{cT}$. The inductor L2 is connected between the drains of the NMOS and PMOS transistors M2 and M4 and the reference voltage source $V_{cT}$. The capacitor C1 is connected between the drains of the NMOS and PMOS transistors M1 and M3 and the ground reference point. The capacitor C2 is connected between the drains of the NMOS and PMOS transistors M2 and M4 and the ground reference point. Again, as described above, it is apparent to those skilled in the art that, while the capacitors C1 and C2 are connected to the ground reference point, the capacitors C1 and C2 may be connected to any reference voltage source or to any power supply voltage source and not effect the operation of the oscillator.

The inductors L1 and L2 and the capacitors C2 and C2 form the frequency dependent gain determining impedance.

The constant current source I1 is connected to the source of the NMOS transistors M1, and the constant current source I2 is connected to the source of the NMOS transistors M2. Similarly, the constant current source I3 is connected to the source of the PMOS transistor M3 and the constant current source I4 is connected to the source of the PMOS transistor M4.

The gain-attenuating circuit is formed by the decoupling capacitors $C_c3$ and $C_c4$. The decoupling capacitor $C_c3$ is connected between the sources of the NMOS transistors M1 and M2. The decoupling capacitor $C_c4$ is connected between the sources of the PMOS transistors M3 and M4.

The gain-attenuating circuit ($C_c3$ and $C_c4$) functions much as described in FIGS. 6a and 6b. For frequencies much, much less than the fundamental frequency $f_0$, the decoupling capacitors $C_c3$ and $C_c4$ have a large impedance and force the gain of the frequency dependent gain circuit to a level much, much less than one to attenuate the low frequency flicker or 1/f noise. Conversely, for frequencies equal to the fundamental frequency $f_c$, the decoupling capacitors Cc3 and Cc4 have low impedance and the frequency dependent gain circuit functions equivalently to that described in FIG. 3. The constant current sources I1 and I2 are summed as described in FIG. 5b and, similarly, the constant current sources I3 and I4 are summed together to function equivalently to the description of FIG. 3.

The high pass bandwidth (BW) of the cross-coupled differential oscillator is a function of the transconductance of the NMOS M1 and M2 and the value of the decoupling capacitor Cc3 and the transconductance of the PMOS transistors M3' and M4 and the value of the decoupling capacitor Cc4 and is determined by the formula:

$$BW = \frac{g_m}{2\pi Cc}.$$

The high pass bandwidth BW must be maintained, as described above, at a level that is much, much smaller than the cutoff frequency of the cross-coupled differential oscillator to prevent loss of the fundamental frequency signal $f_0$. The decoupling capacitor Cc should be chosen such that the fundamental frequency $f_0$ of the cross-coupled differential oscillator is from approximately ten times to approximately twenty times the high pass bandwidth BW of the cross-coupled oscillator.

Figure 8:
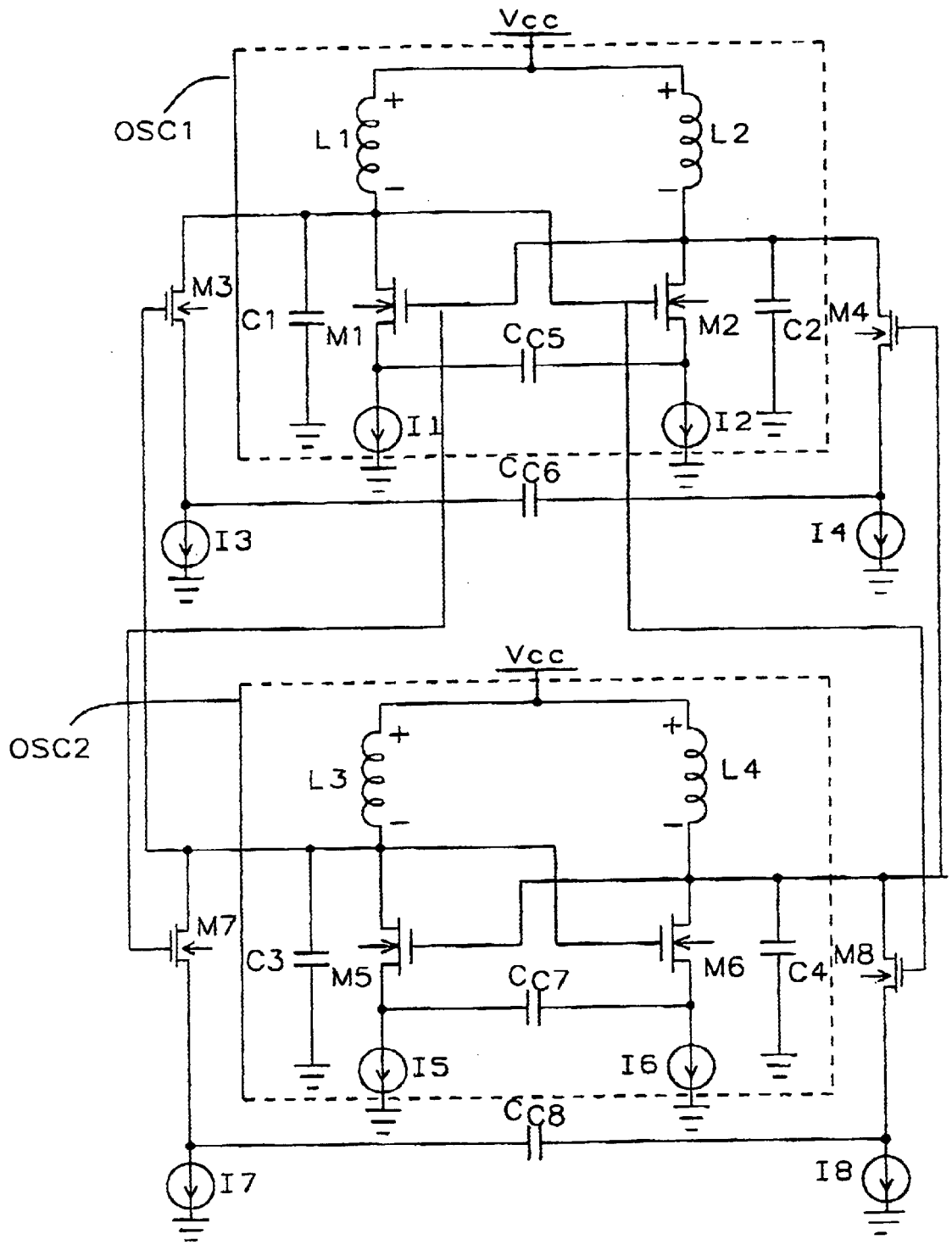
FIG. 8 is a schematic diagram of a quadrature oscillator having low phase noise of this invention having.

FIG. 8 illustrates a quadrature oscillator having low phase noise of this invention. The cross-coupled differential oscillators OSC1 and OSC2 are structured and function as cross-coupled differential oscillators as described in FIG. 5a. The NMOS transistors M3 and M4 and the current sources I3 and I4 form a first coupling circuit. The current source I3 is connected between the source of the NMOS transistor M3 and the ground reference point. The current source I4 is connected between the source of the NMOS transistor M4 and the ground reference point. The gate of the NMOS transistor M3 functions as the in-phase input of the first coupling circuit and the gate of the NMOS transistor M4 functions as the out-of-phase input of the first coupling circuit. The drain of the NMOS transistor M4 functions as the in-phase output of the first coupling circuit and the drain of the NMOS transistor M3 functions as the out-of-phase output of the first coupling circuit. The decoupling capacitor Cc6 is connected between the sources of the NMOS transistors M3 and M4. The decoupling capacitor Cc6 is chosen to function similar to the decoupling capacitor Cc of FIG. 5a to eliminate the phase noise from the first coupling circuit.

The in-phase input of the first coupling circuit is connected to the drain of the NMOS transistor M5 and the gate of the NMOS transistor M6 of the second cross-coupled differential oscillator OSC2. The out-of-phase input of the first coupling circuit is connected to the drain of the NMOS transistor M6 and the gate of the NMOS transistor M5 of the second cross-coupled differential oscillator OSC2. The in-phase output of the first coupling circuit is connected to the drain of the NMOS transistor M2 and the gate of the NMOS transistor M1 of the first cross-coupled differential oscillator OSC1. The out-of-phase output of the first coupling circuit is connected to the drain of the NMOS transistor M1 and the gate of the NMOS transistor M2 of the first cross-coupled differential oscillator OSC1.

The NMOS transistors M7 and M8 and the current sources I7 and I8 form the second coupling circuit. The current source I7 is connected between the source of the NMOS transistor M7 and the ground reference point. The current source I8 is connected between the source of the NMOS transistor M8 and the ground reference point. The gate of the NMOS transistor M7 functions as the in-phase input of the second coupling circuit and the gate of the NMOS transistor M4 functions as the out-of-phase input of the second coupling circuit. The drain of the NMOS transistor M7 functions as the in-phase output of the second coupling circuit and the drain of the NMOS transistor M8 functions as the out-of-phase output of the second coupling circuit. The decoupling capacitor Cc8 is connected between the source of the NMOS transistors M7 and M8. The decoupling capacitor Cc8 is chosen to function similar to the decoupling capacitor Cc of FIG. 5a to eliminate the phase noise from the first coupling circuit.

The in-phase input of the second coupling circuit is connected to the drain of the NMOS transistor M1 and the gate of the NMOS transistor M2 of the first cross-coupled differential oscillator OSC1. The out-of-phase input of the second coupling circuit is connected to the drain of the NMOS transistor M2 and the gate of the NMOS transistor M1 of the first cross-coupled differential oscillator OSC1. The in-phase output of the second coupling circuit is connected to the drain of the NMOS transistor M6 and the gate of the NMOS transistor M5 of the second cross-coupled differential oscillator OSC2. The out-of-phase output of the second coupling circuit is connected to the drain of the NMOS transistor M5 and the gate of the NMOS transistor M6 of the second cross-coupled differential oscillator OSC2.

The in-phase and the out-of-phase of the first coupling circuit are transposed relative to the similar in-phase and out-of-phase connections of the second coupling circuit. This transposition is to force the necessary phase shift to cause the cross-coupled differential oscillations OSC1 and OSC2 to oscillate in quadrature or 90° out of phase as described above in Razavi.

Figure 9:
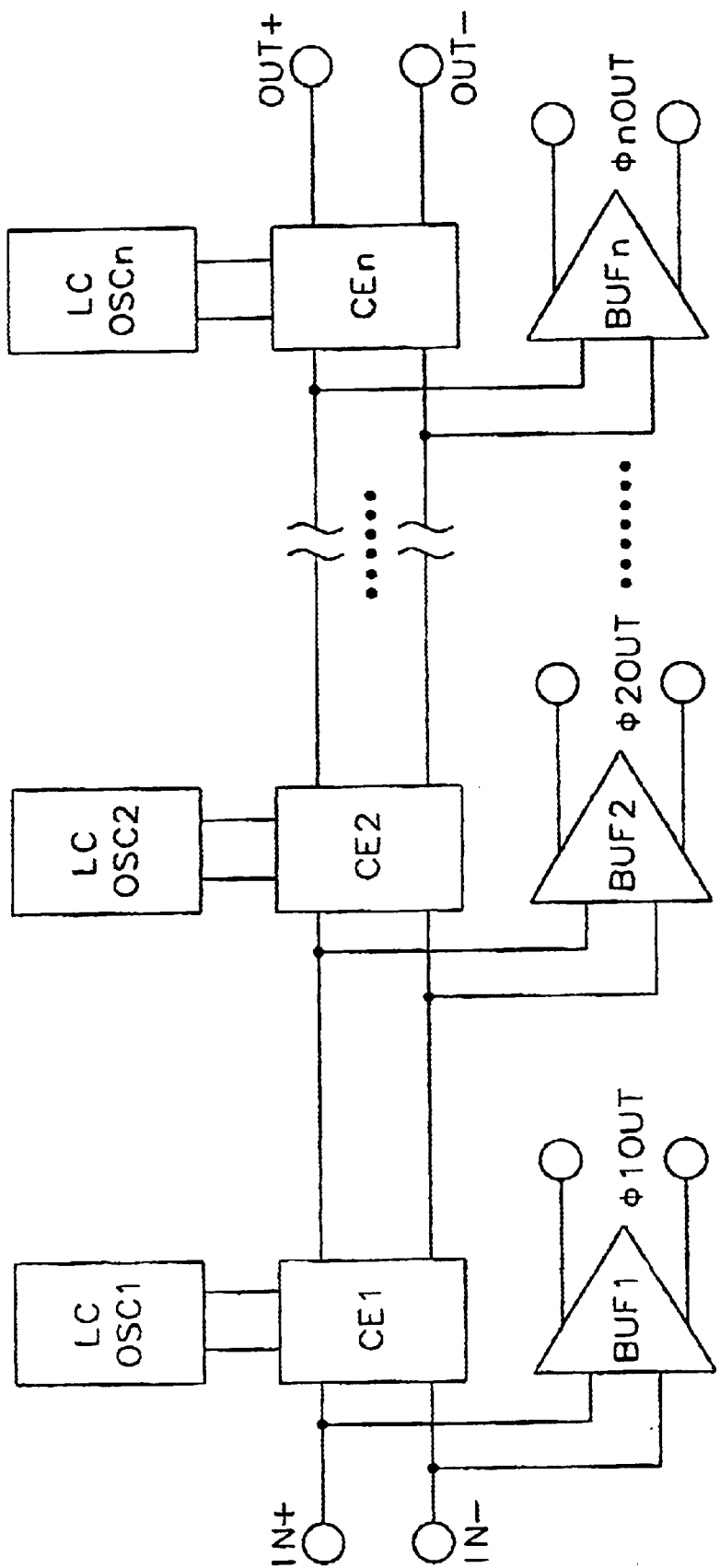
FIG. 9 is a block diagram of a multiple frequency transforming circuit having low phase noise of this invention.

The structure of the oscillator of FIG. 8 is generalized to a structure as shown in FIG. 9. This circuit is used to create multiple phased oscillators, mixers, modulators, demodulators, and any circuit requiring the transforming of the an input signal with multiple frequencies. The frequency transforming circuit of FIG. 9 has multiple coupling elements CE1, CE2, . . . , CEn that are serially connected output to input. The frequency transforming circuit, further, has multiple cross-coupled differential oscillators OSC1, OSC2, . . . , OSCn. The output of each of the multiple cross-coupled differential oscillators OSC1, OSC2, . . . , OSCn is connected to an input of one of the coupling elements coupling elements CE1, CE2, . . . , CEn.

The input signal is developed between the input terminals IN+ and IN− and is transferred to the first coupling element CE1. The input signal is then combined with the oscillatory signal from the first cross-coupled differential oscillator OSC1. The signal at the output of the first coupling element CE1 is transferred to the input the second coupling element CE2 where it is combined with the second oscillatory signal from the second cross-coupled differential oscillator OSC2. The signal at the output of the second coupling element CE2 is transferred to the following coupling elements CEn for combination with the oscillatory signals from the subsequent oscillators OSCn. The signal from the final coupling element CEn is transferred to subsequent circuitry. In the alternative, the output of the last coupling element CEn may be connected to the input of the first coupling element CE1 to feedback the output signal (or a portion of the output signal) to the input of the circuit.

The coupling elements coupling elements CE1, CE2, . . . , CEn, in addition to combining the oscillatory signals from the multiple cross-coupled differential oscillators OSC1, OSC2, . . . , OSCn, may provide phase shifting for a multiple phased oscillator, or any appropriate filtering, integrating, differentiating function.

Further, the outputs of each of the coupling elements CE1, CE2, . . . , CEn is connected to an input of a buffering amplifier BUF1, BUF2, . . . , BUFn. Each of the a buffering amplifiers BUF1, BUF2, . . . , BUFn capture the output of one of the coupling elements CE1, CE2, . . . , CEn and amplifies and isolates the signal to form the output signals φ1, φ2, . . . , φn that are transferred to external circuitry.

Figure 10:
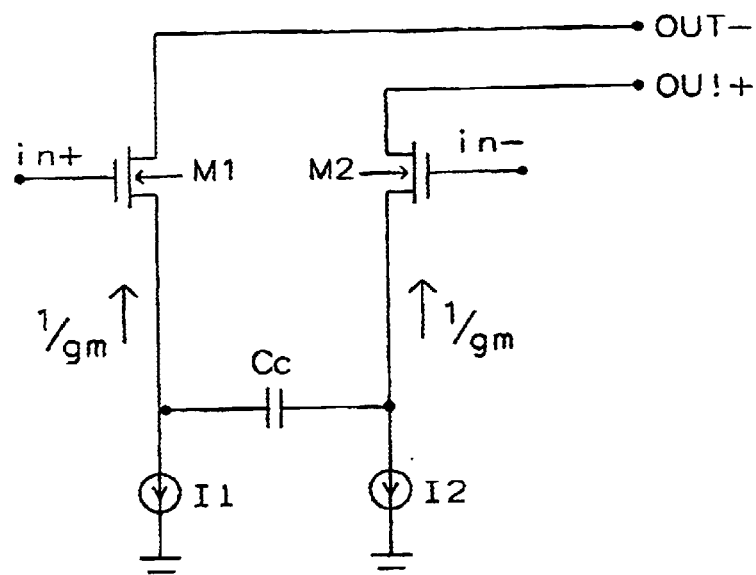
FIG. 10 is a schematic diagram of a differential amplifier having low phase noise of this invention.

Each cross-coupled differential oscillators OSC1, OSC2, . . . , OSCn, each coupling element CE1, CE2, . . . , CEn, and each buffering amplifier BUF1, BUF2, . . . , BUFn has a differential amplifier with low phase noise of this invention as shown in FIG. 10. The differential amplifier is formed by the NMOS transistors M1 and M2 and the current sources I1 and I2.

The gates of the NMOS transistors M1 and M2 respectively form the in-phase input IN+ and the out-of-phase input IN−. The drains of the NMOS transistors M1 and M2 respectively form the in-phase output OUT+ and the out-of-phase output OUT−.

The current source I1 is connected between the source of the NMOS transistor M1 and the ground reference point. The current source I2 is connected between the source of the NMOS transistor M2 and the ground reference point.

The decoupling capacitor Cc is connected between the sources of the NMOS transistors M1 and M2 to provide the necessary gain attenuating to eliminate the phase noise. When the differential amplifier is operating at sufficiently high frequency, the impedance of the decoupling capacitor Cc is very low and the current sources I1 and I2 combine. The differential amplifier operates as a true differential amplifier having very high gain. However, if the frequency of operation is sufficiently low, the impedance of the decoupling capacitor Cc is very high and the gain of the differential amplifier is very low, thus attenuating the signals of the phase noise.

The high pass bandwidth BW of the differential amplifier of this invention is a function of the transconductance ($g_m$) of the NMOS transistors "looking" into the sources and is determined by the formula:

$$BW = \frac{g_m}{2\pi Cc}.$$

For the most successful operation of the differential amplifier the decoupling capacitor Cc should be chosen such that the fundamental frequency f0 of the cross-coupled differential oscillator is from approximately ten times to approximately twenty times the high pass bandwidth BW of the cross-coupled oscillator. This insures that the fundamental frequency f0 is not affected by the operation of the decoupling capacitor Cc.

Figure 11:
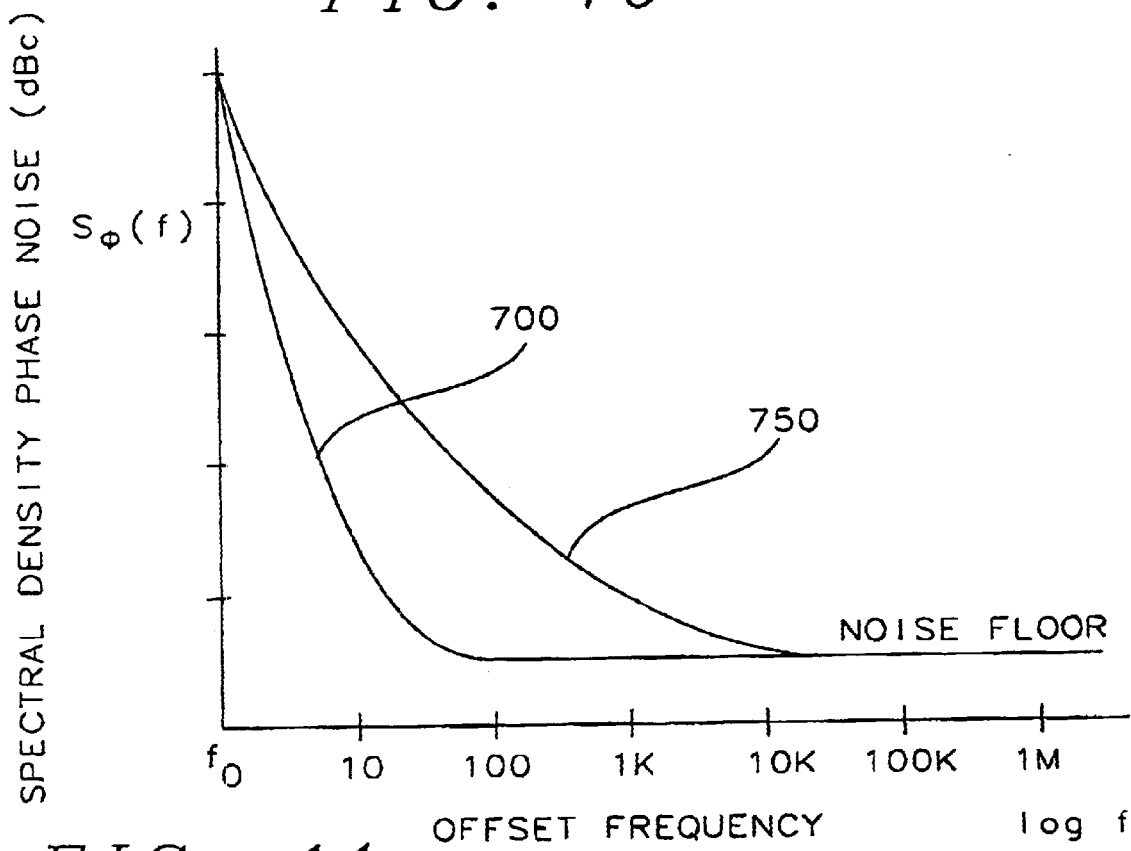
FIG. 11 is a plot of the spectral display of the phase noise versus the frequency offset from the fundamental frequency.

FIG. 11 is plots 700 and 750 that illustrate the spectral density of the phase noise of the output signal versus the frequency offset from the fundamental frequency $f_0$ of cross-coupled differential oscillators of this invention 700 and the prior art. As can be seen, the spectral density of the phase noise of the cross-coupled differential NMOS transistor is lower than an equivalent design of the prior art.

Figure 12A:
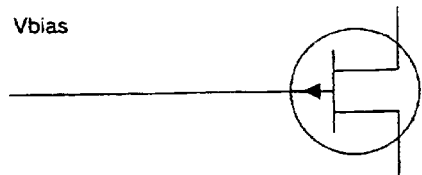
FIG. 12a is a schematic diagram of an ideal current source implemented by a biased MOSFET.
Figure 12B:
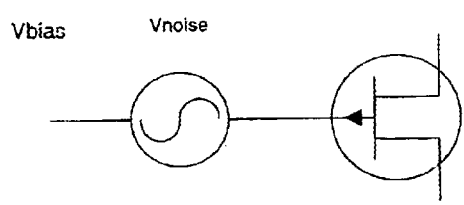
FIG. 12b is a schematic diagram of a current source of FIG. 12a having the noise component represented as a voltage source.
Figure 12C:
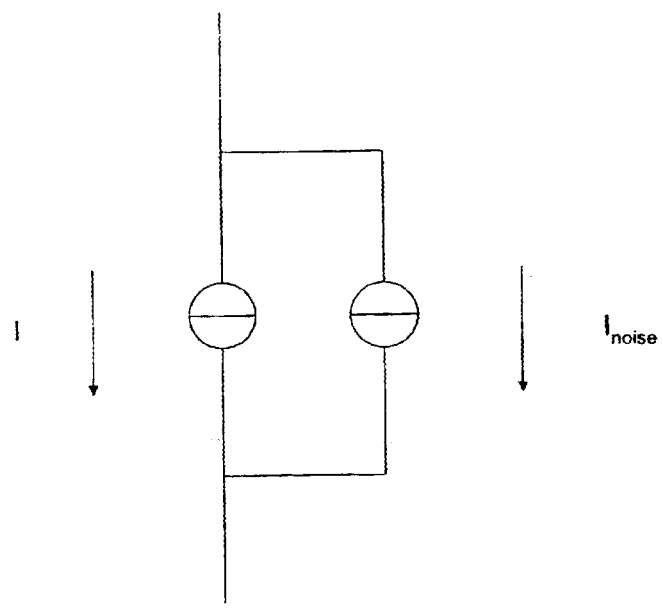
FIG. 12c is a schematic diagram of a current source of FIG. 12a having the noise component represented as a parallel current source.

FIG. 12a is an example of an ideal current source utilized by the present invention. In FIG. 12a the ideal current source is implemented as a MOS transistor which is biased so that the MOS transistor operates in the saturation region. Such a current source may generate a 1/f noise component, which can be significant in MOS devices. This problem is exacerbated at higher frequencies, in which the oscillator of the present invention is designed to operate. Additionally, as the device geometry becomes small the 1/f noise becomes more pronounced. FIG. 12c illustrates an equivalent representation showing a current source I and a noise component current source $I_{noise}$.

Figure 13B:
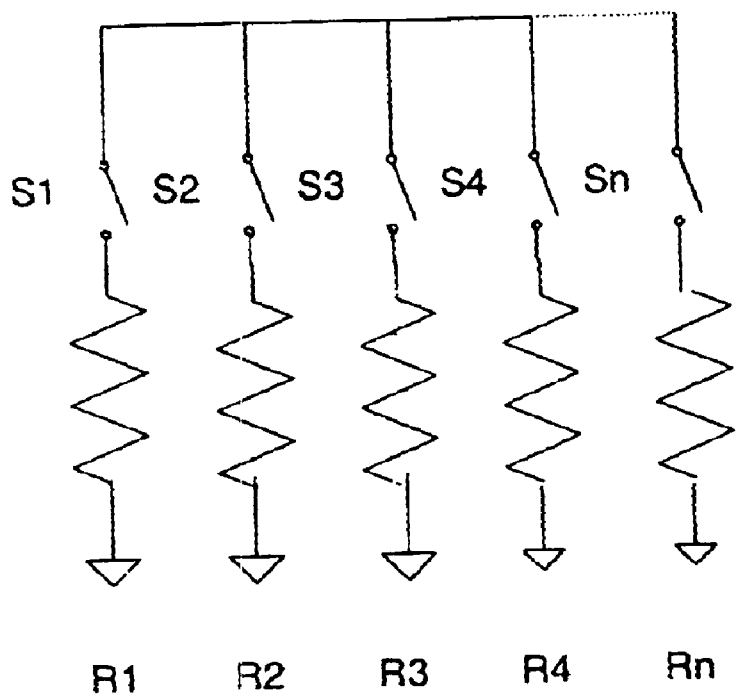
Figure 13A:
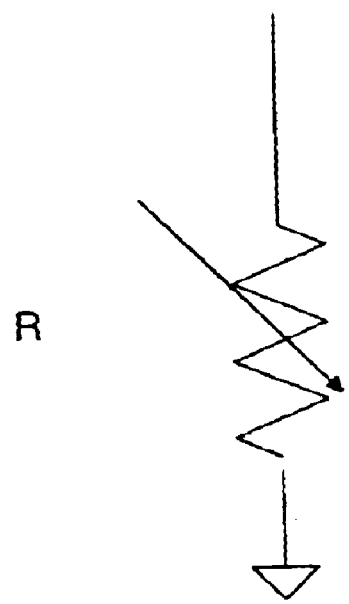
FIG. 13a is a current source implemented as a programmable resistance.

A conventional solution to reduce or eliminate the 1/f noise is to utilize a resistor as the current source. However, it is difficult to set the appropriate amount of resistance for the oscillator to function properly. In accordance with an embodiment of the present invention a programmable resistance R is utilized as the current source, as shown in FIG. 13a. The programmable resistance can insure the appropriate amount of resistance to provide the current to the oscillator. The programmable resistance may be implemented as a switched resistor array. One example of the resistor array is shown in FIG. 13b. The resistor array shown therein comprises resistors R1-Rn and associated switches S1-Sn. Of course as will be appreciated by one of ordinary skill in the art, other resistor configurations may be employed and are within the scope and spirit of the present invention.

Figure 14A:
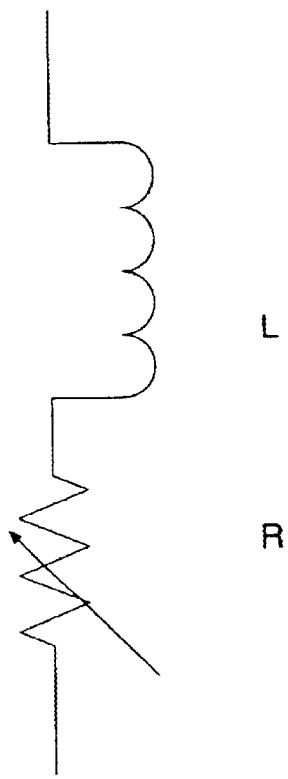
FIG. 14a is a current source implemented as an inductance and programmable resistance.
Figure 14B:
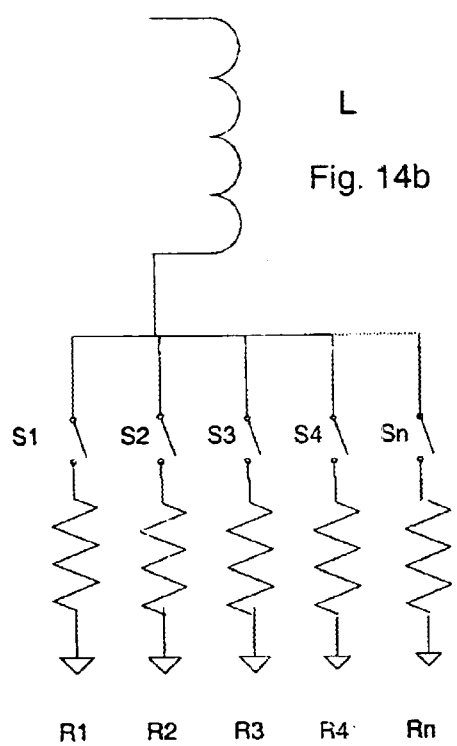
Figure 14C:
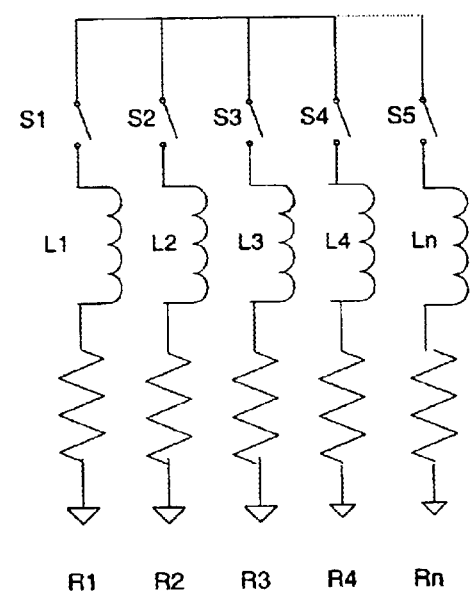

An alternative embodiment of the current source in accordance with the present invention is to utilize an inductance L in series with a programmable resistance R, as shown in FIG. 14a. As with the previous embodiment there is no 1/f noise, since the inductance and resistance are passive components. This configuration behaves like a constant current source regardless of the input voltage, especially if the inductance is sufficiently high, at high frequencies the current is essentially constant (due to the inductance properties). In this embodiment of the programmable resistance may be implemented as a switched resistor array. One example shown therein comprises resistors R1-Rn and associated switches S1-Sn. Of course as will be appreciated by one of ordinary skill in the art, other resistor configurations may be employed and are within the scope and spirit of the present invention. The inductance L inherently has some resistance. Accordingly, the inductance and programmable resistance may be alternatively be implement by a switched inductance array, wherein each inductance inherently has the appropriate amount of resistance.

It will be apparent to those skilled in the art that the NMOS transistors M1 and M2 of FIG. 5a can be replaced by PMOS transistors with appropriate changes to the power supply voltage source $V_{cc}$ and the ground reference point. Further, it would be apparent that the NMOS transistors could be replaced by bipolar junction transistors or other field effect transistors constructed of materials such as Galium-Arsenide and still be in keeping with this invention.

While this invention has been particularly shown and described with reference to the preferred embodiments thereof, it will be understood by those skilled in the art that various changes in form and details may be made without departing from the spirit and scope of the invention.

The invention claimed is:

1. An oscillator having a fundamental frequency and having low phase noise comprising:
    a frequency dependent amplifier;
    a frequency dependent feedback device in communication with an output of said frequency dependent amplifier and an input of said frequency dependent amplifier; and
    an attenuating device in communication with said frequency dependent amplifier to attenuate flicker noise, wherein said attenuating device has a characteristic such that the fundamental frequency is from approximately ten times to twenty times a high pass bandwidth of a combination of the frequency dependent amplifier and the attenuating device, wherein said frequency dependent amplifier comprises another attenuating device.

2. The oscillator of claim 1 wherein said frequency dependent amplifier amplifies an input by a predetermined gain factor, and wherein said frequency dependent feedback device comprises:
    a frequency dependent gain determining impedance in communication with said amplifier, wherein a maximum gain of said frequency dependent amplifier occurs at the fundamental frequency.

3. The oscillator of claim 2 wherein said amplifier comprises:
    a pair of cross-coupled MOS transistors having a drain of each of said pair of cross-coupled MOS transistors being in communication with a gate of the other of said pair of cross-coupled MOS transistors and to a corresponding terminal of said frequency dependent gain determining impedance;
    a first current source having a first terminal in communication with a source of a first one of said pair of cross-coupled MOS transistors and to a first terminal of said attenuating device; and
    a second current source having a first terminal in communication with a source of a second one of said pair of cross-coupled MOS transistors and to a second terminal of said attenuating device.

4. The oscillator of claim 2 wherein said frequency dependent gain determining impedance comprises:
    at least one inductor in communication with said frequency dependent amplifier and a first terminal of a voltage source; and
    at least one capacitor in communication with said frequency dependent amplifier and a second terminal of the voltage source.

5. The oscillator of claim 3 wherein said attenuating device comprises a capacitor.

6. An oscillator having a fundamental frequency and having low phase noise comprising:
    a frequency dependent amplifier;
    a frequency dependent feedback device in communication with an output of said frequency dependent amplifier and an input of said frequency dependent amplifier; and
    an attenuating device in communication with said frequency dependent amplifier to attenuate noise signals having a frequency much less than the fundamental frequency, wherein said frequency dependent amplifier amplifies an input by a predetermined gain factor, and wherein said frequency dependent feedback device comprises:
  a frequency dependent gain determining impedance in communication with said amplifier, wherein a maximum gain of said frequency dependent amplifier occurs at the fundamental frequency;
a second attenuating device, and
wherein said frequency dependent amplifier comprises:
  a first pair of cross-coupled MOS transistors of a first conductivity type having a drain of each of said first pair of cross-coupled MOS transistors being in communication with a gate of the other of said first pair of cross-coupled MOS transistors and to a corresponding terminal of said frequency dependent gain determining impedance;
  a first current source in communication with a source of one of said first pair of cross-coupled MOS transistors of the first conductivity type and with a first terminal of said attenuating device;
  a second current source in communication with a source of a second one of said first pair of cross-coupled MOS transistors of the first conductivity type and with a second terminal of said attenuating device;
  a second pair of cross-coupled MOS transistors of a second conductivity type whereby a drain of each of said second pair of cross-coupled MOS transistors is connected to a gate of the other of said second pair of cross-coupled MOS transistors and to one terminal of said frequency dependent gain determining impedance;
  a third current source in communication with a source of one of said second pair of cross-coupled MOS transistors and with a first terminal of said second attenuating device; and
  a fourth current source in communication with a source of the other of said second pair of cross-coupled MOS transistors of the second conductivity type and with a second terminal of said second attenuating device.

7. The oscillator of claim 6 wherein said attenuating device comprises a first capacitor.

8. The oscillator of claim 6 wherein said second attenuating device comprises a second capacitor.

9. An LC oscillator having a fundamental frequency and having low phase noise comprising:
  a frequency dependent amplifier comprising:
    a pair of cross-coupled MOS transistors of a first conductivity type, a drain of each of said pair of cross-coupled MOS being in communication with a gate of the other one of said pair of cross-coupled MOS transistors,
    a first current source in communication with a source of one of said pair of cross-coupled MOS transistors, and
    a second current source in communication with a source of another of said pair of cross-coupled MOS transistors;
  a frequency dependent gain determining circuit comprising:
    a first inductor in communication with the drain of said one of said pair of cross-coupled MOS transistors and a first terminal of a voltage source,
    a second inductor in communication with the drain of the other of said pair of cross-coupled MOS transistors and the first terminal of the voltage source,
    a first capacitor in communication with the drain of said one of said of said pair of cross-coupled MOS transistors and a second terminal of the voltage source, and
    a second capacitor in communication with the drain of the other of said pair of cross-coupled MOS transistors and the second terminal of the voltage source; and
  an attenuating device in communication with said frequency dependent amplifier to reduce the gain of signals having frequencies less than the fundamental frequency to decrease the phase noise, wherein said attenuating device comprises a third capacitor in communication with said first and second current sources, wherein said attenuating device has a characteristic such that the fundamental frequency is from approximately ten times to twenty times a high pass bandwidth of a combination of said frequency dependent amplifier and said attenuating device.

10. An LC oscillator having a fundamental frequency and having low phase noise comprising:
  a frequency dependent amplifier comprising:
    a pair of cross-coupled MOS transistors of a first conductivity type, a drain of each of said pair of cross-coupled MOS being in communication with a gate of the other one of said pair of cross-coupled MOS transistors,
    a first current source in communication with a source of one of said pair of cross-coupled MOS transistors, and
    a second current source in communication with a source of another of said pair of cross-coupled MOS transistors;
  a frequency dependent gain determining circuit comprising
    a first inductor in communication with the drain of said one of said pair of cross-coupled MOS transistors and a first terminal of a voltage source,
    a second inductor in communication with the drain of the other of said pair of cross-coupled MOS transistors and the first terminal of the voltage source,
    a first capacitor in communication with the drain of said one of said of said pair of cross-coupled MOS transistors and a second terminal of the voltage source, and
    a second capacitor in communication with the drain of the other of said pair of cross-coupled MOS transistors and the second terminal of the voltage source; and
  an attenuating circuit in communication with said frequency dependent amplifier to reduce the gain of signals having frequencies less than the fundamental frequency to decrease the phase noise, wherein said attenuating circuit comprises a third capacitor in communication with said first and second current sources,
  wherein said frequency dependent amplifier further comprises:
    a second pair of cross-coupled MOS transistors of a second conductivity type each having a drain connected to a gate of the other of second pair of cross-coupled MOS,
    a third current source in communication with a source of one of said second pair of cross-coupled MOS transistors, and
    a fourth current source in communication with a source of the other of said second pair of cross-coupled MOS.

11. The LC oscillator of claim 10 wherein said attenuating circuit further comprises a fourth capacitor in communication with said third and fourth current sources.

12. An RF communication device comprising:
an oscillator having a fundamental frequency and having low phase noise comprising:
a frequency dependent amplifier;
a frequency dependent feedback device in communication with an output of said frequency dependent amplifier and an input of said frequency dependent amplifier; and
an attenuating device in communication with said frequency dependent amplifier to attenuate noise signals having a frequency much less than the fundamental frequency,
wherein said attenuating device has a characteristic such that the fundamental frequency is from approximately ten times to twenty times a high pass bandwidth of a combination of the frequency dependent amplifier and the attenuating device; wherein the frequency dependent amplifier comprises a second attenuating device.

13. The RF communication device of claim 12 wherein said device comprises an RF receiver and said oscillator comprises a local oscillator to demodulate a carrier frequency signal received by said RF receiver.

14. The RF communication device of claim 12 wherein said frequency dependent amplifier amplifies an input signal by a predetermined gain factor, and wherein said frequency dependent feedback device comprises:
a frequency dependent gain determining impedance in communication with said frequency dependent amplifier, wherein a maximum gain of said frequency dependent amplifier occurs at the fundamental frequency.

15. The RF communication device of claim 14 wherein said frequency dependent amplifier comprises:
a pair of cross-coupled MOS transistors having a drain of each of said pair of cross-coupled MOS transistors being in communication with a gate of the other of said pair of cross-coupled MOS transistors and to a corresponding terminal of said frequency dependent gain determining impedance;
a first current source having a first terminal in communication with a source of a first one of said pair of cross-coupled MOS transistors and with a first terminal of said attenuating device; and
a second current source having a first terminal in communication with a source of a second one of said pair of cross-coupled MOS transistors and with a second terminal of said attenuating device.

16. The RF communication device of claim 14 wherein said frequency dependent gain determining impedance comprises:
at least one inductor in communication with said frequency dependent amplifier and a first terminal of a voltage source; and
at least one capacitor in communication with said frequency dependent amplifier and a second terminal of the voltage source.

17. The RF communication device of claim 15 wherein said attenuating device comprises a capacitor.

18. The RF communication device of claim 15, and wherein said amplifier comprises:
a first pair of cross-coupled MOS transistors of a first conductivity type having a drain of each of said first pair of cross-coupled MOS transistors being in communication with a gate of the other of said first pair of cross-coupled MOS transistors and to a corresponding terminal of said frequency dependent gain determining impedance;
a first current source in communication with a source of one of said first pair of cross-coupled MOS transistors of the first conductivity type and with a first terminal of said attenuating device;
a second current source in communication with a source of a second one of said first pair of cross-coupled MOS transistors of the first conductivity type and with a second terminal of said attenuating device;
a second pair of cross-coupled MOS transistors of a second conductivity type wherein a drain of each of said second pair of cross-coupled MOS transistors is connected to a gate of the other of said second pair of cross-coupled MOS transistors and to one terminal of said frequency dependent gain determining impedance;
a third current source in communication with a source of one of said second pair of cross-coupled MOS transistors and with a first terminal of said second attenuating device; and
a fourth current source in communication with a source of the other of said second pair of cross-coupled MOS transistors of the second conductivity type and to a second terminal of said second attenuating device.

19. The RF communication device of claim 18 wherein said attenuating device comprises a first capacitor.

20. The RF communication device of claim 18 wherein said second attenuating device comprises a second capacitor.

21. A frequency transforming apparatus having low phase noise comprising:
a first oscillator having a first fundamental frequency comprising:
a first frequency dependent amplifier;
a first frequency dependent feedback device in communication with an output of said first frequency dependent amplifier and an input of said first frequency dependent amplifier; and
a first attenuating device in communication with said first frequency dependent amplifier to attenuate noise signals having a frequency much less than the first fundamental frequency;
a second oscillator having a second fundamental frequency comprising:
a second frequency dependent amplifier;
a second frequency dependent feedback device in communication with an output of said second frequency dependent amplifier and an input of said second frequency dependent amplifier; and
a second attenuating device in communication with said second frequency dependent amplifier to attenuate noise signals having a frequency much less than the second fundamental frequency; and
a frequency dependent coupling circuit having a third fundamental frequency in communication with an output of the first oscillator and an input of the second oscillator, said frequency dependent coupling circuit comprising:
a third frequency amplifier, and
a third attenuating device in communication with said third frequency dependent amplifier to attenuate noise signals having frequencies much less than the third fundamental frequency.

22. The frequency transforming apparatus of claim 21 wherein said first and second attenuating devices each have a respective characteristic such that the first and second fundamental frequencies are from approximately ten times to twenty times a high pass bandwidth of a respective combination of said first and second frequency dependent amplifiers, said first and second attenuating devices and said third frequency dependent amplifier and said third attenuating device.

23. The frequency transforming apparatus of claim 21 wherein said first, second and third frequency dependent amplifiers each amplifies an input by a respective predetermined gain factor,
   wherein said first frequency dependent feedback device comprises:
      a first frequency dependent gain determining impedance in communication with said first amplifier, wherein a first maximum gain of said first frequency dependent amplifier occurs at the first fundamental frequency, and
   wherein said second frequency dependent feedback device comprises:
      a second frequency dependent gain determining impedance in communication with said second amplifier, wherein a second maximum gain of said second frequency dependent amplifier occurs at the second fundamental frequency.

24. The frequency transforming apparatus of claim 23 wherein said first frequency dependent amplifier comprises:
   a first pair of cross-coupled MOS transistors having a drain of each of said first pair of cross-coupled MOS transistors being in communication with a gate of the other of said first pair of cross-coupled MOS transistors and to a corresponding terminal of said first frequency dependent gain determining impedance;
   a first current source having a first terminal in communication with a source of a first one of said first pair of cross-coupled MOS transistors and with a first terminal of said first attenuating device; and
   a second current source having a first terminal in communication with a source of a second one of said first pair of cross-coupled MOS transistors and with a second terminal of said first attenuating device, and
wherein said second frequency dependent amplifier comprises:
   a second pair of cross-coupled MOS transistors having a drain of each of said second pair of cross-coupled MOS transistors being in communication with a gate of the other of said second pair of cross-coupled MOS transistors and to a corresponding terminal of said second frequency dependent gain determining impedance;
   a third current source having a first terminal in communication with a source of a first one of said second pair of cross-coupled MOS transistors and with a first terminal of said second attenuating device; and
   a fourth current source having a first terminal in communication with a source of a second one of said second pair of cross-coupled MOS transistors and with a second terminal of said second attenuating device.

25. The frequency transforming apparatus of claim 23 wherein each of said first and second frequency dependent gain determining impedance comprises:
   at least one inductor in communication with a respective one of said first and second frequency dependent amplifiers and a first terminal of a voltage source; and
   at least one capacitor in communication with said a respective one of said first and second frequency dependent amplifiers and a second terminal of the voltage source.

26. The frequency transforming apparatus of claim 25 wherein the first, second and third attenuating devices each comprises a capacitor.

27. The frequency transforming apparatus of claim 23 wherein said first and second oscillators each comprise another attenuating device,
   wherein said first and second frequency dependent amplifiers each comprises:
      a first pair of cross-coupled MOS transistors of a first conductivity type having a drain of each of said first pair of cross-coupled MOS transistors being in communication with a gate of the other of said first pair of cross-coupled MOS transistors and to a corresponding terminal of a respective one of said frequency dependent gain determining impedances;
      a first current source in communication with a source of one of said first pair of cross-coupled MOS transistors of the first conductivity type and with a first terminal of a respective one of said attenuating devices;
      a second current source in communication with a source of a second one of said first pair of cross-coupled MOS transistors of the first conductivity type and with a second terminal of a respective one of said attenuating devices;
      a second pair of cross-coupled MOS transistors of a second conductivity type wherein a drain of each of said second pair of cross-coupled MOS transistors is connected to a gate of the other of said second pair of cross-coupled MOS transistors and to one terminal of a respective one of said frequency dependent gain determining impedances;
      a third current source in communication with a source of one of said second pair of cross-coupled MOS transistors and with a first terminal of a respective one of said other attenuating devices; and
      a fourth current source in communication with a source of the other of said second pair of cross-coupled MOS transistors of the second conductivity type and to a fourth second terminal of a respective one of said other attenuating devices.

28. The frequency transforming apparatus of claim 27 wherein said first attenuating device and said respective other attenuating device each comprises a first capacitor.

29. The frequency transforming apparatus of claim 28 wherein said second attenuating device and said respective other attenuating device each comprises a second capacitor.

30. The frequency transforming apparatus of claim 21 wherein said frequency dependent coupling circuit is selected from the group of coupling circuits consisting of phase shifters, frequency mixers, frequency shifters, modulators, and demodulators.

31. A multiple frequency oscillation circuit having low phase noise, comprising:
   a first oscillator having a first fundamental frequency comprising:
      a first frequency dependent amplifier;
      a first frequency dependent feedback device in communication with an output of said first frequency dependent amplifier and an input of said first frequency dependent amplifier; and
      a first attenuating device in communication with said first frequency dependent amplifier to attenuate noise signals having a frequency much less than the first fundamental frequency;

a second oscillator having a second fundamental frequency comprising:
  a second frequency dependent amplifier;
  a second frequency dependent feedback device in communication with an output of said second frequency dependent amplifier and an input of said second frequency dependent amplifier; and
  a second attenuating device in communication with said second frequency dependent amplifier to attenuate noise signals having a frequency much less than the second fundamental frequency; and
a frequency dependent coupling circuit having a third fundamental frequency in communication with an output of the first oscillator and an input of the second oscillator, said frequency dependent coupling circuit comprising:
  a third frequency dependent amplifier, and
  a third attenuating device in communication with said third frequency dependent amplifier to attenuate noise signals having frequencies much less than the third fundamental frequency.

32. The multiple frequency oscillation circuit of claim 31 wherein said first and second attenuating devices each has a respective characteristic such that the first and second fundamental frequencies are from approximately ten times to twenty times a high pass bandwidth of a respective combination of said first and second frequency dependent amplifiers, said first and second attenuating devices and said third frequency dependent amplifier and said third attenuating device.

33. The multiple frequency oscillation circuit of claim 31 wherein said first, second and third frequency dependent amplifiers each amplifies an input by a respective predetermined gain factor,
  wherein said first frequency dependent feedback device comprises:
    a first frequency dependent gain determining impedance in communication with said first frequency dependent amplifier, wherein a first maximum gain of said first frequency dependent amplifier occurs at the first fundamental frequency, and
  wherein said second frequency dependent feedback device comprises:
    a second frequency dependent gain determining impedance in communication with said second frequency dependent amplifier, wherein a second maximum gain of said second frequency dependent amplifier occurs at the second fundamental frequency.

34. The multiple frequency oscillation circuit of claim 33 wherein said first frequency dependent amplifier comprises:
  a first pair of cross-coupled MOS transistors having a drain of each of said first pair of cross-coupled MOS transistors being in communication with a gate of the other of said first pair of cross-coupled MOS transistors and to a corresponding terminal of said first frequency dependent gain determining impedance;
  a first current source having a first terminal in communication with a source of a first one of said first pair of cross-coupled MOS transistors and with a first terminal of said first attenuating device; and
  a second current source having a first terminal in communication with a source of a second one of said first pair of cross-coupled MOS transistors and with a second terminal of said first attenuating device, and
wherein said second frequency dependent amplifier comprises:
  a second pair of cross-coupled MOS transistors having a drain of each of said second pair of cross-coupled MOS transistors being in communication with a gate of the other of said second pair of cross-coupled MOS transistors and to a corresponding terminal of said second frequency dependent gain determining impedance;
  a third current source having a first terminal in communication with a source of a first one of said second pair of cross-coupled MOS transistors and with a first terminal of said second attenuating device; and
  a fourth current source having a first terminal in communication with a source of a second one of said second pair of cross-coupled MOS transistors and with a second terminal of said second attenuating device.

35. The multiple frequency oscillation circuit of claim 33 wherein each of said first and second frequency dependent gain determining impedances comprises:
  at least one inductor in communication with a respective one of said first and second frequency dependent amplifiers and a first terminal of a voltage source; and
  at least one capacitor in communication with said respective one of said first and second amplifiers and a second terminal of the voltage source.

36. The multiple frequency oscillation circuit of claim 35 wherein said first, second and third attenuating devices each comprises a capacitor.

37. The multiple frequency oscillation circuit of claim 33 wherein said first and second oscillators each comprises another attenuating device,
  wherein said first and second frequency dependent amplifiers each comprises:
    a first pair of cross-coupled MOS transistors of a first conductivity type having a drain of each of said first pair of cross-coupled MOS transistors being in communication with a gate of the other of said first pair of cross-coupled MOS transistors and to a corresponding terminal of a respective one of said frequency dependent gain determining impedances;
    a first current source in communication with a source of one of said first pair of cross-coupled MOS transistors of the first conductivity type and with a first terminal of a respective one of said attenuating devices;
    a second current source in communication with a source of a second one of said first pair of cross-coupled MOS transistors of the first conductivity type and with a second terminal of a respective one of said attenuating devices;
    a second pair of cross-coupled MOS transistors of a second conductivity type whereby a drain of each of said second pair of cross-coupled MOS transistors is connected to a gate of the other of said second pair of cross-coupled MOS transistors and to one terminal of a respective one of said frequency dependent gain determining impedances;
    a third current source in communication with a source of one of said second pair of cross-coupled MOS transistors and with a first terminal of a respective one of said other attenuating devices; and
    a fourth current source in communication with a source of the other of said second pair of cross-coupled MOS transistors of the second conductivity type and to a fourth second terminal of a respective one of said other attenuating devices.

38. The multiple frequency oscillation circuit of claim 37 wherein said first attenuating device and said respective other attenuating device each comprises a first capacitor.

39. The multiple frequency oscillation circuit of claim 38 wherein said second attenuating device and said respective other attenuating device each comprises a second capacitor.

40. The multiple frequency oscillation circuit of claim 31 wherein said frequency dependent coupling circuit generate phase shifts of the first and second fundamental frequencies.

41. The multiple frequency oscillation circuit of claim 40 wherein the first and second fundamental frequencies are 90° out of phase.

42. A quadrature oscillator circuit having low phase noise, comprising:
- a first oscillator having a first fundamental frequency comprising:
  - a first frequency amplifier;
  - a first frequency dependent feedback device in communication with an output of said first frequency dependent amplifier and an input of said first frequency dependent amplifier to feed a portion of an amplified signal having the first fundamental frequency to an input of said first frequency dependent amplifier; and
  - a first attenuating device in communication with said first frequency dependent gain amplifier for reducing the gain of said first frequency dependent amplifier for signals having frequencies much less than the first fundamental frequency to decrease said phase noise; and
- a first frequency dependent coupling circuit having a second fundamental frequency having an input in communication with the output of the first frequency dependent amplifier, said first frequency dependent coupling circuit comprising:
  - a second frequency dependent amplifier, and
  - a second attenuating device in communication with said second frequency dependent amplifier for reducing the gain of said frequency dependent amplifier for signals having frequencies much less than said second fundamental frequency to decrease said phase noise;
- a second oscillator to generate a second fundamental signal having a third fundamental frequency having low phase noise, in communication with an output of the second frequency dependent amplifier, and said second oscillator comprising:
  - a third frequency dependent amplifier;
  - a respective frequency dependent feedback device in communication with an output of said third frequency dependent amplifier and an input of said third frequency dependent amplifier to feed a portion of an amplified signal having the third fundamental frequency to an input of said third frequency dependent amplifier; and
  - a third attenuating device in communication with the third frequency dependent amplifier for reducing the gain of said third frequency dependent amplifier for signals having frequencies much less than the third fundamental frequency to decrease the phase noise; and
- a second frequency dependent coupling circuit having a fourth fundamental frequency having an input in communication with the output of said third frequency dependent amplifier and the input of said first frequency dependent such that a phase of the third fundamental frequency is reversed relative to a phase of the first fundamental frequency, and comprising:
  - a fourth frequency dependent amplifier, and
  - a fourth attenuating device in communication with said second frequency dependent amplifier for reducing the gain of said fourth frequency dependent amplifier for signals having frequencies much less than said fourth fundamental frequency to decrease the phase noise.

43. The quadrature oscillator circuit of claim 42 wherein said first, second, third and fourth attenuating devices each has a characteristic such that the first, second, third and fourth fundamental frequencies are each from approximately ten times to twenty times a high pass bandwidth of a respective combination of said first frequency dependent amplifier and said first attenuating device and of said third frequency dependent amplifier and said third attenuating device.

44. The quadrature oscillator circuit of claim 42 wherein said first, second, third and fourth frequency dependent amplifiers each amplify an input signal by respective predetermined gain factors, wherein said first, second, third and fourth frequency dependent each comprises:
- a frequency dependent gain determining impedance in communication with a corresponding one of said first, second, third and fourth frequency dependent amplifiers, wherein the maximum gain of each of said corresponding one of said first, second, third and fourth frequency dependent amplifiers, occurs at a respective one of the first, second, third and fourth fundamental frequencies.

45. The quadrature oscillator circuit of claim 44 wherein each of said first, second, third and fourth frequency dependent amplifiers comprises:
- a pair of cross-coupled MOS transistors whereby a drain of each of pair of cross-coupled MOS transistors is in communication with a gate of another one of said pair of cross-coupled MOS transistors and said frequency dependent gain determining impedance;
- a first current source in communication with a source of one of said pair of cross-coupled MOS transistors and to a first terminal of a voltage source and to a first terminal of a respective one of said first, second, third and fourth attenuating devices; and
- a second current source in communication with a source of the other one of said pair of cross-coupled MOS transistors and to a first terminal of a respective one of said first, second, third and fourth attenuating devices.

46. The quadrature oscillator circuit of claim 44 wherein each of said first, second, third and fourth frequency dependent gain determining impedances comprises:
- at least one inductor in communication with of a respective one of said first, second, third and fourth amplifiers and a second terminal of the voltage source; and
- at least one capacitor in communication with of a respective one of said first, second, third and fourth amplifiers and a third terminal of the voltage source.

47. The quadrature oscillator circuit of claim 46 wherein each of said first, second, third and fourth attenuating devices comprises a capacitor.

48. The quadrature oscillator circuit of claim 44 wherein each of said first, second, third and fourth frequency dependent amplifiers comprises:
- an additional attenuating device;
- a first cross-coupled pair of MOS transistors of the first conductivity type having a drain of each of said first cross-coupled pair of MOS transistors in communication with a gate of the other of said first cross-coupled pair of MOS transistors and to a terminal of a respective one of said first, second, third and fourth frequency dependent gain determining impedances;

a first current source in communication with a source of one of said first-coupled pair of MOS transistors and to a first terminal of a respective one of said first, second, third and fourth attenuating devices;

a second current source in communication with a source of the other said first cross-coupled pair of MOS transistors and to a terminal of a respective one of said first, second, third and fourth attenuating devices;

a second cross-coupled pair of MOS transistors of the second conductivity type have a drain of each of second cross-coupled pair of MOS transistors in communication with a gate of the other of second cross-coupled pair of MOS transistors and to the first terminal of a respective one of said first, second, third and fourth attenuating devices;

a third current source in communication with a source of one of said second cross-coupled pair of MOS transistors and to a first terminal of said additional attenuating device; and a fourth current source in communication with a source of the other of said second cross-coupled pair of MOS transistors and to a second terminal of said additional attenuating device.

49. The quadrature oscillator circuit of claim 48 wherein said first, second, third and fourth attenuating devices each comprises a first capacitor.

50. The quadrature oscillator circuit of claim 48 said additional attenuating device comprises a second capacitor.

51. The quadrature oscillator circuit of claim 40 wherein said second frequency dependent coupling circuit generates a phase shift of the second fundamental frequency.

52. A differential amplifier possessing low phase noise, comprising:

a first transistor having a first terminal to receive an in-phase signal, and a second terminal to provide an out-of-phase signal;

a second transistor having a first terminal to receive the out-of-phase signal, and a second terminal to provide the in-phase signal;

a first biasing source in communication with a third terminal of said first transistor and a first terminal of a voltage source;

a second biasing source in communication with a third terminal of the second transistor and the first terminal of the voltage source; and an attenuating capacitor in communication with the third terminal of said first transistor and the third terminal of said second transistor, said capacitor decreases gain of said differential amplifier at low frequencies to eliminate phase noise components from the in-phase and the out-of-phase signals, wherein a high pass bandwidth of said differential amplifier is determined as follows:

$$BW = \frac{g_m}{2\pi Cc}$$

where:
BW is the high pass bandwidth,
$g_m$ is the transconductance of said first and second transistors as measured as the third terminals, and
Cc is the value of said attenuating capacitor, wherein the high pass bandwidth is less than a cutoff frequency of a circuit employing said differential amplifier, and wherein the differential amplifier comprises another attenuating capacitor.

53. The differential amplifier of claim 52 wherein the cutoff frequency of the circuit containing said differential amplifier is from approximately 10 times to approximately 20 times the high pass bandwidth of said differential amplifier.

54. The differential amplifier of claim 52 wherein said first and second transistors are selected from the group of transistors consisting of NMOS transistors, PMOS transistors, and bipolar transistors.

55. The differential amplifier of claim 52 wherein said first and second biasing sources are selected from the group of biasing sources consisting of current sources and resistors.

56. An LC oscillator having a fundamental frequency and having low phase noise comprising:

a frequency dependent amplifier comprising:
a pair of cross-coupled MOS transistors of a first conductivity type, a drain of each of said pair of cross-coupled MOS being in communication with a gate of the other one of said pair of cross-coupled MOS transistors,
a first current in communication with a source of one of said pair of cross-coupled MOS transistors, wherein said first current source comprises a first programmable resistance, and
a second current source in communication with a source of another of said pair of cross-coupled MOS transistors, wherein said second current source comprises a second programmable resistance;
a capacitance in communication with the source of the one of said pair of cross-coupled MOS transistors and the source of another of said pair of cross-coupled MOS transistors to filter flicker noise;

a frequency dependent gain determining circuit comprising
a first inductor in communication with the drain of said one of said pair of cross-coupled MOS transistors and a first terminal of a voltage source,
a second inductor in communication with the drain of the other of said pair of cross-coupled MOS transistors and the first terminal of the voltage source,
a first capacitor in communication with the drain of said one of said of said pair of cross-coupled MOS transistors and a second terminal of the voltage source, and
a second capacitor in communication with the drain of the other of said pair of cross-coupled MOS transistors and the second terminal of the voltage source.

57. An LC oscillator having a fundamental frequency and having low phase noise comprising:

a frequency dependent amplifier comprising:
a pair of cross-coupled MOS transistors of a first conductivity type, a drain of each of said pair of cross-coupled MOS being in communication with a gate of the other one of said pair of cross-coupled MOS transistors,
a first current source in communication with a source of one of said pair of cross-coupled MOS transistors, wherein said first current source comprises a first programmable resistance, and
a second current source in communication with a source of another of said pair of cross-coupled MOS transistors, wherein said second current source comprises a second programmable resistance;

a frequency dependent gain determining circuit comprising
a first inductor in communication with the drain of said one of said pair of cross-coupled MOS transistors and a first terminal of a voltage source, a second inductor in communication with the drain of the other of said pair of cross-coupled MOS transistors and the first terminal of the voltage source, a first capacitor in communication with the drain of said one of said of said pair of cross-coupled MOS transistors and a second terminal of the voltage source, and a second capacitor in communication with the drain of the other of said pair of cross-coupled MOS transistors and the second terminal of the voltage source, wherein the first current source comprises the first inductor in communication with said first programmable resistance, and wherein the second current source comprises the second inductor in communication with said second programmable resistance.

58. An LC oscillator having a fundamental frequency and having low phase noise comprising:

a frequency dependent amplifier comprising:
   a pair of cross-coupled MOS transistors of a first conductivity type, a drain of each of said pair of cross-coupled MOS being in communication with a gate of the other one of said pair of cross-coupled MOS transistors,
   a first current source in communication with a source of one of said pair of cross-coupled MOS transistors, wherein said first current source comprises a first programmable inductance, and
   a second current source in communication with a source of another of said pair of cross-coupled MOS transistors, wherein said second current source comprises a second programmable inductance;
   a capacitance in communication with the source of the one of said pair of cross-coupled MOS transistors and the source of another of said pair of cross-coupled MOS transistors to filter flicker noise;

a frequency dependent gain determining circuit comprising:
   a first inductor in communication with the drain of said one of said pair of cross-coupled MOS transistors and a first terminal of a voltage source,
   a second inductor in communication with the drain of the other of said pair of cross-coupled MOS transistors and the first terminal of the voltage source,
   a first capacitor in communication with the drain of said one of said of said pair of cross-coupled MOS transistors and a second terminal of the voltage source, and
   a second capacitor in communication with the drain of the other of said pair of cross-coupled MOS transistors and the second terminal of the voltage source.

59. An LC oscillator having a fundamental frequency and having low phase noise comprising:

a frequency dependent amplifier comprising:
   a pair of cross-coupled MOS transistors of a first conductivity type, a drain of each of said pair of cross-coupled MOS being in communication with a gate of the other one of said pair of cross-coupled MOS transistors,
   a first current source in communication with a source of one of said pair of cross-coupled MOS transistors, and
   a second current source in communication with a source of another of said pair of cross-coupled MOS transistors;

a frequency dependent gain determining circuit comprising
   a first inductor in communication with the drain of said one of said pair of cross-coupled MOS transistors and a first terminal of a voltage source,
   a second inductor in communication with the drain of the other of said pair of cross-coupled MOS transistors and the first terminal of the voltage source,
   a first capacitor in communication with the drain of said one of said of said pair of cross-coupled MOS transistors and a second terminal of the voltage source, and
   a second capacitor in communication with the drain of the other of said pair of cross-coupled MOS transistors and the second terminal of the voltage source; and an attenuating circuit in communication with said frequency dependent amplifier to reduce the gain of signals having frequencies less than the fundamental frequency to decrease the phase noise, wherein said attenuating circuit comprises a third capacitor in communication with said first and second current sources, wherein said first current source comprises a first programmable resistance, and wherein said second current source comprises a second programmable resistance.

60. An LC oscillator having a fundamental frequency and having low phase noise comprising:

a frequency dependent amplifier comprising:
   a pair of cross-coupled MOS transistors of a first conductivity type, a drain of each of said pair of cross-coupled MOS being in communication with a gate of the other one of said pair of cross-coupled MOS transistors,
   a first current source in communication with a source of one of said pair of cross-coupled MOS transistors, and
   a second current source in communication with a source of another of said pair of cross-coupled MOS transistors;

a frequency dependent gain determining circuit comprising
   a first inductor in communication with the drain of said one of said pair of cross-coupled MOS transistors and a first terminal of a voltage source,
   a second inductor in communication with the drain of the other of said pair of cross-coupled MOS transistors and the first terminal of the voltage source,
   a first capacitor in communication with the drain of said one of said of said pair of cross-coupled MOS transistors and a second terminal of the voltage source, and
   a second capacitor in communication with the drain of the other of said pair of cross-coupled MOS transistors and the second terminal of the voltage source; and an attenuating circuit in communication with said frequency dependent amplifier to reduce flicker noise, wherein said attenuating circuit comprises a third capacitor in communication with said first and second current sources, wherein said first current source comprises a first programmable inductance, and wherein said second current source comprises a second programmable inductance.

* * * * *